(12) United States Patent
Ono

(10) Patent No.: US 7,465,998 B2
(45) Date of Patent: Dec. 16, 2008

(54) SEMICONDUCTOR DEVICE

(75) Inventor: Mizuki Ono, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 350 days.

(21) Appl. No.: 11/144,697

(22) Filed: Jun. 6, 2005

(65) Prior Publication Data
US 2006/0063319 A1    Mar. 23, 2006

(30) Foreign Application Priority Data
Sep. 21, 2004    (JP)    ............................ 2004-273509

(51) Int. Cl.
*H01L 29/76* (2006.01)
(52) U.S. Cl. ...................... 257/401; 257/365
(58) Field of Classification Search ................. 257/401, 257/368, 365
See application file for complete search history.

(56) References Cited

FOREIGN PATENT DOCUMENTS

| | | |
|---|---|---|
| JP | 4-137562 | 5/1992 |
| JP | 08-172198 | * 2/1996 |
| JP | 08-172198 | 7/1996 |
| JP | 8-264777 | 10/1996 |
| JP | 10-93093 | 4/1998 |
| JP | 2001-77364 | 3/2001 |
| JP | 2003-209247 | 7/2003 |
| JP | 2003-289141 | 10/2003 |
| WO | WO 2005/074035 | 8/2005 |

OTHER PUBLICATIONS

Notification of Reasons for Rejection issued Dec. 4, 2007 in Japanese Application No. 2004-273509 with English translation (7 pages).

* cited by examiner

*Primary Examiner*—Kiesha L Rose
(74) *Attorney, Agent, or Firm*—Finnegan, Henderson, Farabow, Garrett & Dunner, L.L.P.

(57) ABSTRACT

A semiconductor device includes a plate of semiconductor layer, an insulator layer formed on the plate of semiconductor layer and brought into contact with the plate of semiconductor layer by at least two adjacent faces, a thickness of the insulator layer in the vicinity of a boundary line between the two adjacent faces being larger than that of the insulator layer in a region other than the vicinity of the boundary line, and a band of conductor layer formed facing a middle portion of the plate-like semiconductor layer via the insulator layer.

9 Claims, 17 Drawing Sheets

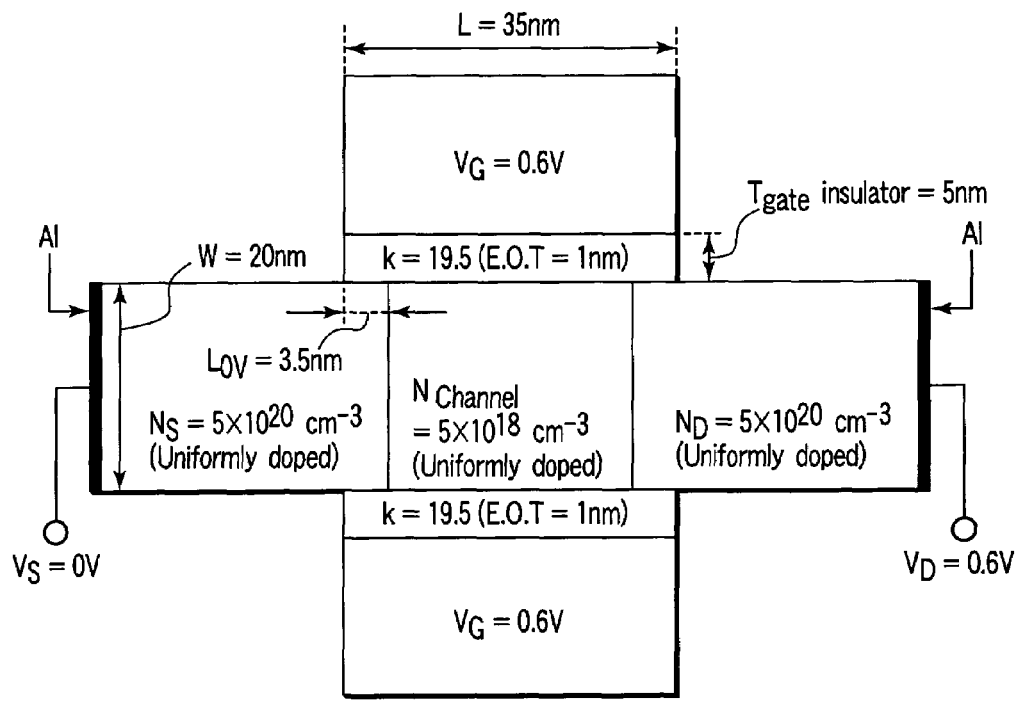
FIG. 3
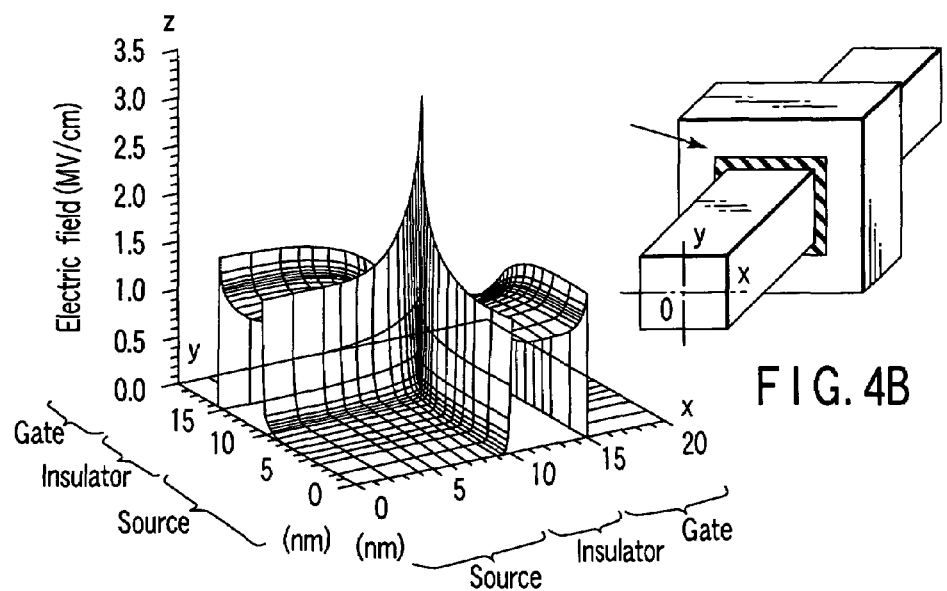
FIG. 4A
FIG. 4B

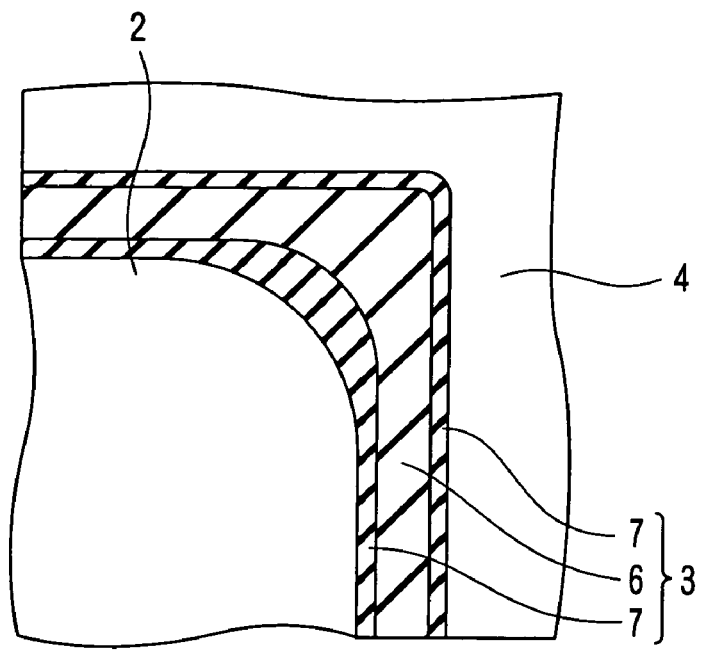
F I G. 20
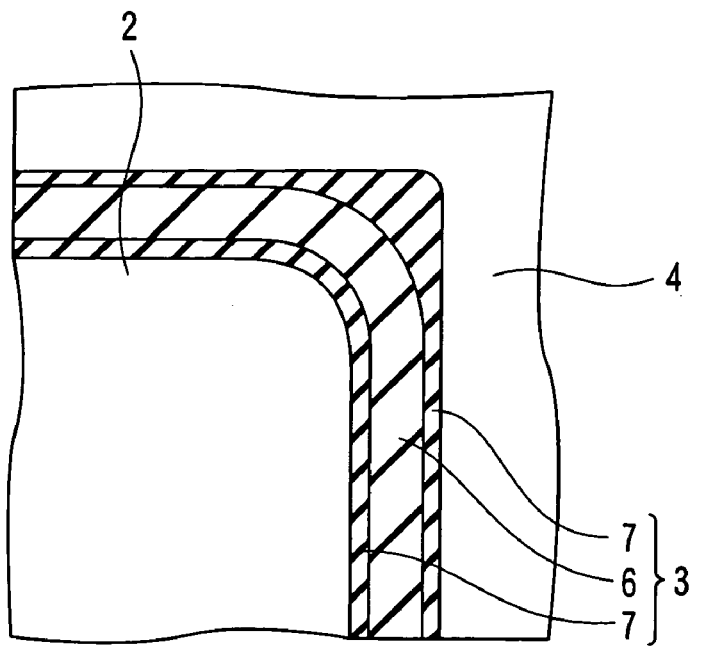
F I G. 21

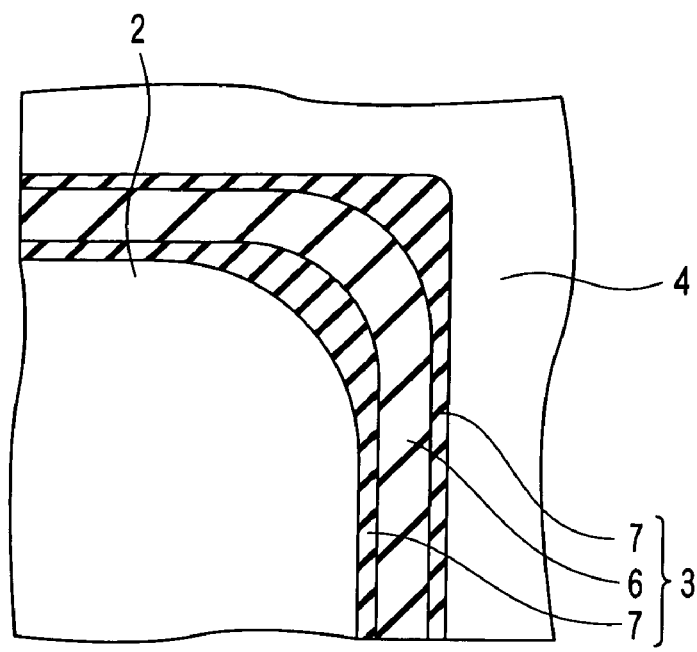
F I G. 22
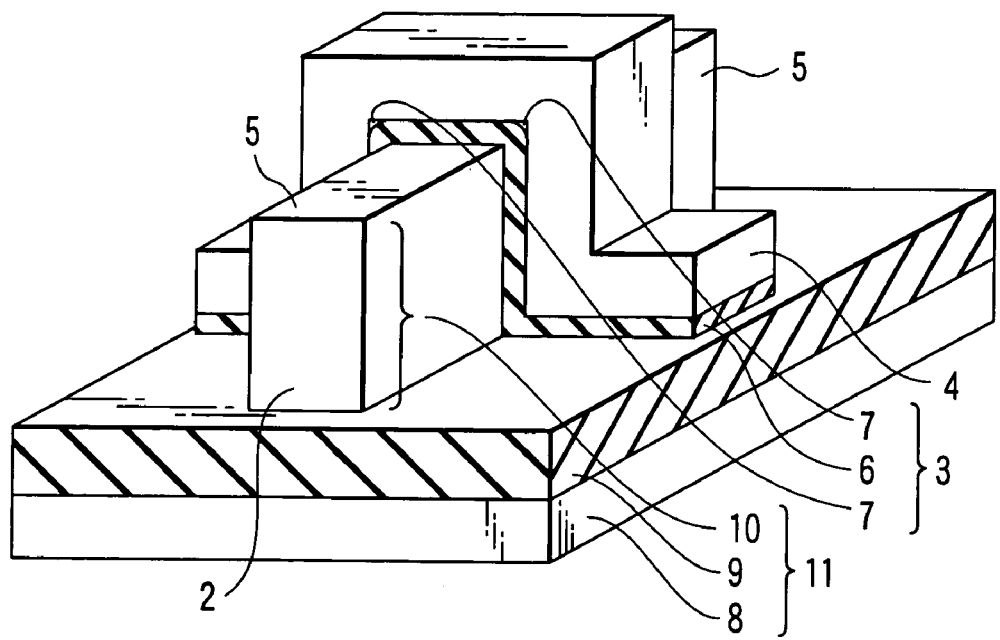
F I G. 23

SEMICONDUCTOR DEVICE

CROSS-REFERENCE TO RELATED APPLICATIONS

This application is based upon and claims the benefit of priority from prior Japanese Patent Application No. 2004-273509, filed Sep. 21, 2004, the entire contents of which are incorporated herein by reference.

BACKGROUND OF THE INVENTION

1. Field of the Invention

The present invention relates to a semiconductor device including a field-effect transistor, and a method of manufacturing the device.

2. Description of the Related Art

An integrated circuit has been highly integrated, and accordingly an MOS field-effect transistor (FET) which is a constituting element has been increasingly miniaturized. When the miniaturization of the MOSFET is advanced following a scaling rule, a gate insulating film becomes very thin, the withstand voltage degrades between a source/drain region and a gate electrode in an edge portion of a gate electrode to which a high electric field is applied during operation, and a leakage current is generated. To handle this problem, in Jpn. Pat. Appln. KOKAI Publication No. 4-137562, a plurality of insulating films having different permittivities are disposed between a gate electrode and a semiconductor substrate, the permittivity of the insulating film on a gate electrode side is raised, and the film is extended to the side face of the gate electrode. In Jpn. Pat. Appln. KOKAI Publication No. 8-264777, a technique has been disclosed in which the gate electrode is surrounded with a material having a comparatively high permittivity, and accordingly an electric field is reduced even in the gate insulating film or gate side wall in the vicinity of the gate electrode, especially in opposite end portions of the gate insulating film.

On the other hand, a tri-gate type field-effect transistor has been developed in which a fin-like (plate-like) semiconductor region is disposed on a substrate, and gate electrodes are disposed on three faces of a middle portion via gate insulating films. In this tri-gate type field-effect transistor, the gate electrodes exist on the opposite side faces and upper faces of the semiconductor region in which a channel is formed. This constitution enhances controllability of the gate electrode with respect to the potential of the channel region as compared with a field-effect transistor having a usual structure. As a result, a short channel effect is inhibited, an element is miniaturized, and an element operation can be speeded up. However, in a structure of a region in which the channel is formed and which has an edge (arris), there is a phenomenon in which a strong electric field is generated in the edge portion, causing degradation in reliability. This is an obstacle to realization of high-speed operation of the element.

To reduce the electric field in the gate insulating film, for example, it is supposed that the gate insulating film be formed to be thick. However, when the gate insulating film is formed to be thick, capacitive coupling between the channel region and the gate electrode is weakened. As a result, controllability of the gate electrode with respect to the potential of the channel region is lowered, the short channel effect is enhanced, and degradation of a current driving capability of the element is caused.

Thus, there exists a field-effect transistor of such a type that the semiconductor region in which the channel is formed is brought into contact with the gate insulating film via a plurality of faces, and the edge exists in boundaries among the faces as in the tri-gate type field-effect transistor. In this field-effect transistor, the above-described tradeoff lies between the enhancement of controllability of the gate electrode and the enhancement of the reliability, and this has been an obstacle to speeding-up the operation of the element.

Therefore, there has been a demand for realization of a high-performance semiconductor device capable of relaxing a strong electric field in a gate insulating film in the vicinity of an edge of a semiconductor region in which a channel region is formed to enhance reliability of an element and enable operation at a sufficiently high speed.

BRIEF SUMMARY OF THE INVENTION

According to a first aspect of the invention, there is provided a semiconductor device, which comprises:

a plate of semiconductor layer;

an insulator layer formed on the plate of semiconductor layer and brought into contact with the plate of semiconductor layer by at least two adjacent faces, a thickness of the insulator layer in the vicinity of a boundary line between the two adjacent faces being larger than that of the insulator layer in a region other than the vicinity of the boundary line; and a band of conductor layer formed facing a middle portion of the plate of semiconductor layer via the insulator layer.

According to a second aspect of the invention, there is provided a method of manufacturing a semiconductor device, which comprises:

preparing a semiconductor substrate on which a first semiconductor layer is formed via a first insulating layer;

selectively etching away the first semiconductor layer to leave a plate of semiconductor region on the first insulating layer;

coating a second insulating layer having a first permittivity on the first insulating layer which includes the plate of semiconductor region formed thereon;

forming a third insulating layer having a second permittivity lower than the first permittivity on an edge portion of the plate of semiconductor region via the second insulating layer; and forming a band of electrode so as to cross the plate of semiconductor region via the second insulating layer and the third insulating layer.

According to a third aspect of the invention, there is provided a method of manufacturing a semiconductor device, which comprises:

preparing a semiconductor substrate on which a silicon layer is formed via a first insulating layer;

selectively etching away the silicon layer to leave a plate of silicon region on the first insulating layer;

forming a silicon oxide film in the vicinity of an edge portion of the plate of semiconductor region;

coating the second insulating layer having a permittivity larger than that of a silicon oxide film on the first insulating layer which includes the plate of silicon region formed thereon; and forming a band of electrode so as to cross the plate of silicon region via the second insulating layer.

BRIEF DESCRIPTION OF THE SEVERAL VIEWS OF THE DRAWING

FIG. 3 is a sectional view of the gate all around type field-effect transistor for use in simulation of the present invention;

FIG. 4A is a diagram showing distribution of electric field intensity in a plane of a source end of a gate electrode obtained by simulation, and FIG. 4B is a diagram showing a position of the source end face and definition of x, y coordinate;

FIG. 20 shows an enlarged sectional view of the channel edge portion of the semiconductor device of the present invention, and shows a diagram of an eighth constitution of the gate insulating film;

FIG. 21 shows an enlarged sectional view of the channel edge portion of the semiconductor device of the present invention, and shows a diagram of a ninth constitution of the gate insulating film;

FIG. 22 shows an enlarged sectional view of the channel edge portion of the semiconductor device of the present invention, and shows a diagram of a tenth constitution of the gate insulating film;

FIG. 23 is a schematic perspective view showing a structure of a field-effect transistor according to a first embodiment of the present invention;

DETAILED DESCRIPTION OF THE INVENTION

Figure 1:
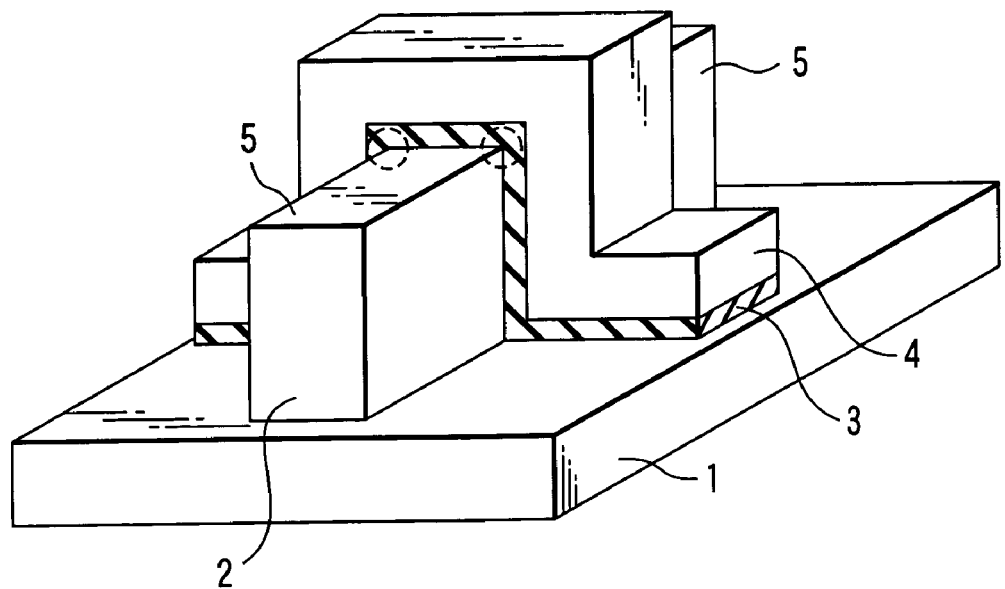
FIG. 1 is a schematic perspective view of a conventional tri-gate type field-effect transistor.

A problem of a general tri-gate type field-effect transistor will be described in detail with reference to FIG. 1 prior to description of embodiments of the present invention. FIG. 1 shows an example of an N-channel field-effect transistor.

As shown in FIG. 1, in a conventional tri-gate type field-effect transistor, a fin (plate) of semiconductor region 2 exists on a substrate 1, and a gate insulating film 3 is formed in such a manner as to cover a portion (middle portion) in which a channel of the semiconductor region 2 is formed. The portion in which the channel of the semiconductor region 2 is formed is doped with P-type impurities to form an N-channel region. Moreover, a band of gate electrode 4 is formed in such a manner as to face a portion of the semiconductor region 2 in which the channel is formed via the gate insulating film 3. Further in the semiconductor region 2, a source/drain region (conductive region) 5 is formed via the channel region facing the gate electrode 4. It is to be noted that in FIG. 1, a wiring metal, a contact region for coupling the wiring metal with respect to the gate electrode 4 and the source/drain region 5, an interlayer insulating film and the like are omitted.

In the above-described tri-gate type field-effect transistor, the semiconductor region 2 is brought into contact with the gate insulating film 3 via upper and side faces of a portion of the semiconductor region 2 in which the channel is formed, and an edge or arris (a straight line or boundary line at which adjacent faces of a polyhedron cross each other) exists in a boundary between the faces. In general, since an electric field becomes remarkably strong in the vicinity of a corner having a convex shape of a conductive material, the electric field in the gate insulating film (portion shown by a dotted circle in FIG. 1) becomes remarkably strong in the vicinity of the edge. Accordingly, breakdown of the gate insulating film is easily induced in the vicinity of the edge, and a problem occurs that reliability of the element degrades.

In general, the electric field in the vicinity of the corner forming the convex shape of the conductive material indicates a stronger value, when resistivity of the conductive material forming the convex shape lowers. In addition, if the source/drain region has no overlapping with the gate electrode, the current drivability of the transistor is reduced, so that the source/drain region is so formed as to have overlapping with the gate electrode.

Since impurities are introduced into the source/drain region 5 with high concentration in order to lower the resistivity, the electric field in the gate insulating film in the vicinity of the above-described edge becomes remarkably strong. Furthermore, there is an element such as a Schottky field-effect transistor in which a portion corresponding to the source/drain region of the conventional field-effect transistor is formed of a metal. Especially in this case, the electric field in the gate insulating film in the vicinity of the edge is remarkably strong, thus the problem of the degradation in reliability is serious.

On the other hand, in the field-effect transistor of the present invention, as described above, the gate insulating film is formed to be thick in the vicinity of the edge of the region in which the channel is formed, and formed to be thin in another region. Therefore, since capacitive coupling between the channel region and the gate electrode is kept to be strong in a region other than the vicinity of the edge, the short channel effect is suppressed, and current driving capability is high. Moreover, the electric field in the gate insulating film in the vicinity of the edge is reduced, and a high reliability is realized.

Figure 2:
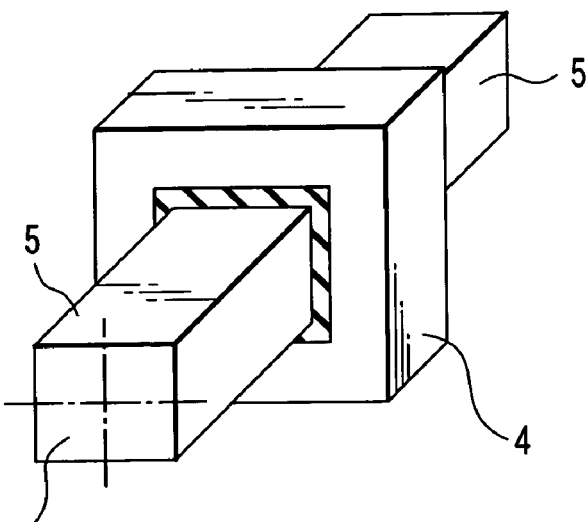
FIG. 2 is a schematic perspective view of a gate all around type field-effect transistor which is one of objects of the present invention.
Figure 5:
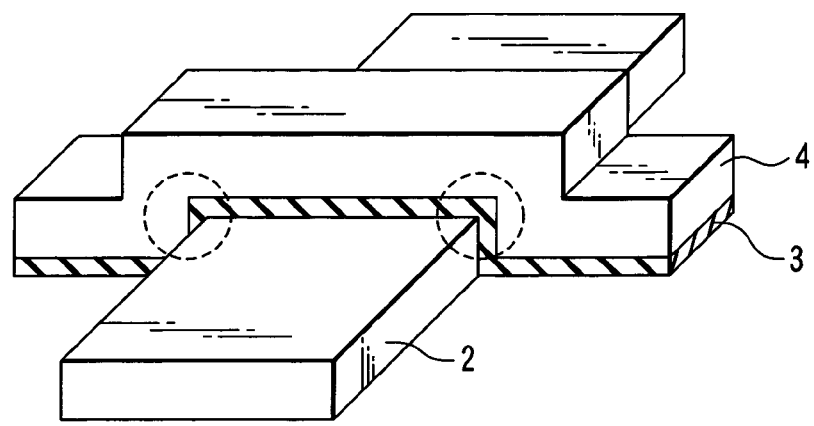
FIG. 5 is a schematic perspective view showing a structure of a mesa isolation SOI element and a problem thereof.
Figure 6:
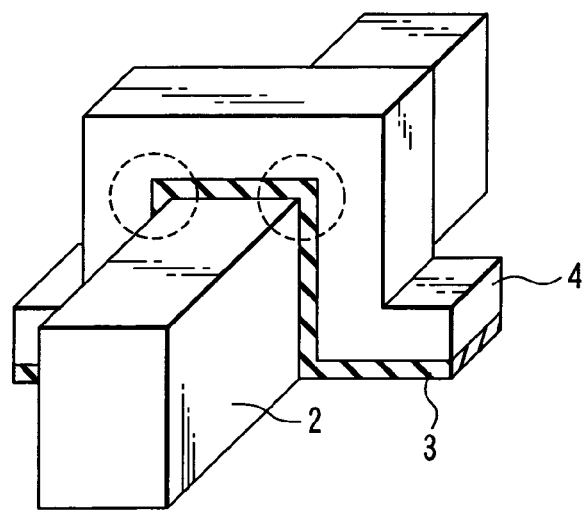
FIG. 6 is a schematic perspective view showing the structure and problem of a tri-gate element.
Figure 7:
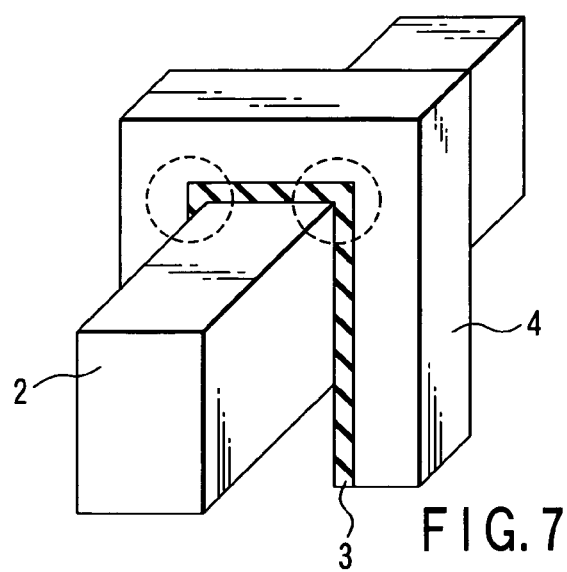
FIG. 7 is a schematic perspective view showing the structure and problem of a pi-gate element.
Figure 8:
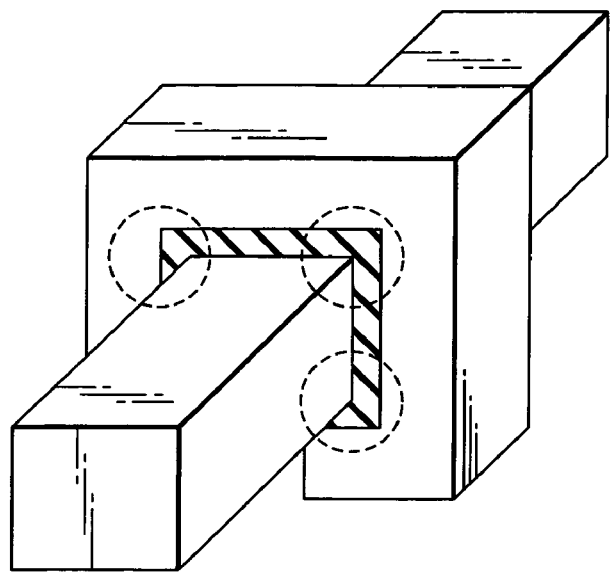
FIG. 8 is a schematic perspective view showing the structure and problem of an omega-gate element.
Figure 9:
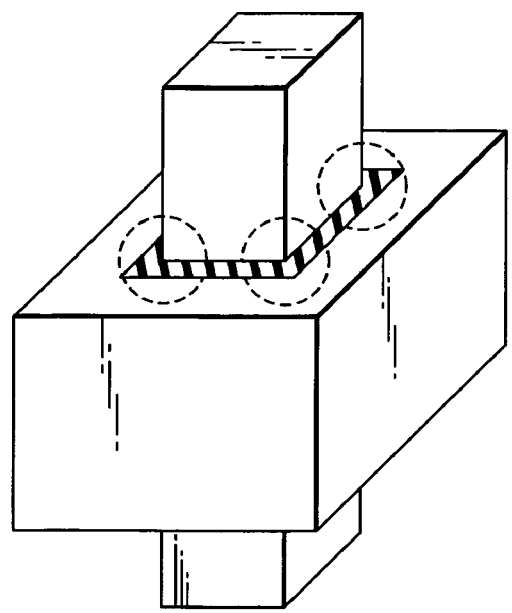
FIG. 9 is a schematic perspective view showing the structure and problem of a vertical structure element.

As one example, a gate all around (GAA) type field-effect transistor shown in FIG. 2 is considered. In this field-effect transistor, unlike the structure shown in FIG. 1, a portion in which a channel of the semiconductor region 2 is formed is surrounded with the gate electrode 4. In this structure, channels are formed on four faces, that is, upper/lower and right/left faces of the semiconductor region 2. Moreover, boundaries among the channels form edges. An electric field intensity in the gate insulating film structured in this manner was studied by simulation.

A sectional structure of an element used in the simulation is shown in FIG. 3. It is to be noted that a central line of the portion of the semiconductor region 2 in which the channel is formed is a 4-fold axis of this structure, and therefore actual simulation was performed with respect to ¼ of the structure, shown by dotted lines in FIG. 2. Potentials of terminals were set to a gate potential (VG)=0.6 V, drain potential (VD)=0.6 V, and source potential (VS)=0 V. Since the potential in the channel increases from 0 V to 0.6 V from a source side toward a drain side, a potential difference between the channel and the gate electrode monotonously decreases from the source side toward the drain side. Therefore, the electric field in the gate insulating film becomes most intense at the source end.

FIG. 4A shows a distribution of electric field intensity in the insulating film in the face (shown by an arrow in FIG. 4B) of a source end of the gate electrode. In FIG. 4A, the z-axis (ordinate) indicates the magnitude of the electric field, and coordinates of the x, y plane (plane vertical to z-axis) represent positions in the above-described "face of the source end of the gate electrode". The origin of the coordinates is taken along the central line of the semiconductor region 2 in which the channel is formed. That is, the x or y coordinate axis of FIG. 4A is set in a direction for viewing the gate insulating film and gate electrode from the central line of the semiconductor region in which the channel is formed. In either of coordinates x, y in the plane, a region of 10 nm or less is the semiconductor region 2 in which the channel is formed, a region between 10 nm and 15 nm is the insulator 3, and a region between 15 nm and 20 nm is the gate electrode 4.

It is seen from FIGS. 4A and 4B that the electric field intensity in the gate insulating film indicates a large value only in a remarkably small region in the vicinity of the edge (around a point of 10 nm both in the x and y-coordinates) of the semiconductor region in which the channel is formed. That is, the field-effect transistor having the GAA structure is assumed in this simulation, but this result and the following results are not limited to an element having a GAA structure. They are similarly established even with respect to edges (shown by dotted-line circles in the figures) in a mesa-isolation SOI element, tri-gate element, pi-gate element, omega-gate element, and vertical structure element as schematically show in FIGS. 5 to 9. Moreover, the simulation performed herein can be interpreted as simulation of the electric field intensity in which only the vicinity of the edge in the element of the structure having the edge is extracted, as schematically shown in FIGS. 2 and 5 to 9. That is, it is understood that the electric field in the gate insulating film having the structure including the edge indicates a remarkably large value in the very vicinity of the edge, for example, as schematically shown in these figures. This is a newly obtained finding.

It is assumed that the thickness of the gate insulating film is 5 nm in the simulation showing the result in FIG. 4. In addition, the simulation was also performed about a structure in which only the thickness of the gate insulating film in the above structure was changed to 10 nm. When the electric field intensity in the plane of the source end of the gate electrode is checked with respect to the element having this structure, the intensity is reduced to about 0.8 MV/cm, whereas the intensity is about 3 MV/cm in the vicinity of the edge in the element (thickness of the gate insulating film is 5 nm) showing the structure in FIG. 3.

Figure 10:
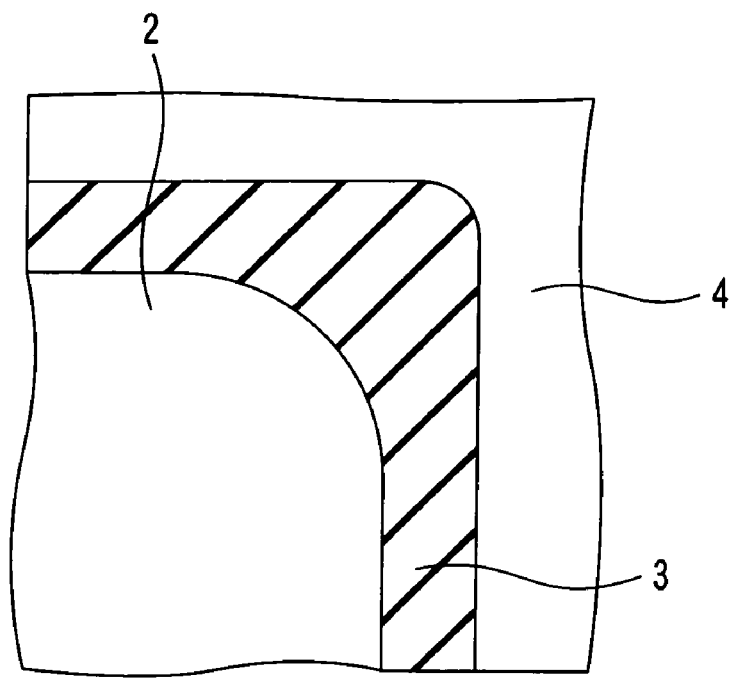
FIG. 10 shows an enlarged sectional view of a channel edge (arris) portion of the semiconductor device of the present invention, and shows a diagram of a first constitution of a gate insulating film.

As described above, this simulation is directed to only the vicinity of the edge of the element. Therefore, as seen from the above-described result, it is effective that the gate insulating film is so formed to be thick in the vicinity of the edge to reduce the electric field in the gate insulating film. This is also a newly obtained finding in this study. As a structure in which the gate electrode is formed to be thick only in the vicinity of the edge of the semiconductor region where the channel is formed, for example, a structure schematically shown in FIG. 10 is considered. FIG. 10 shows an enlargement of the area in the vicinity of the edge in cross section. The plane of the cross section is perpendicular to the direction of current which flows through the channel.

Figure 11:
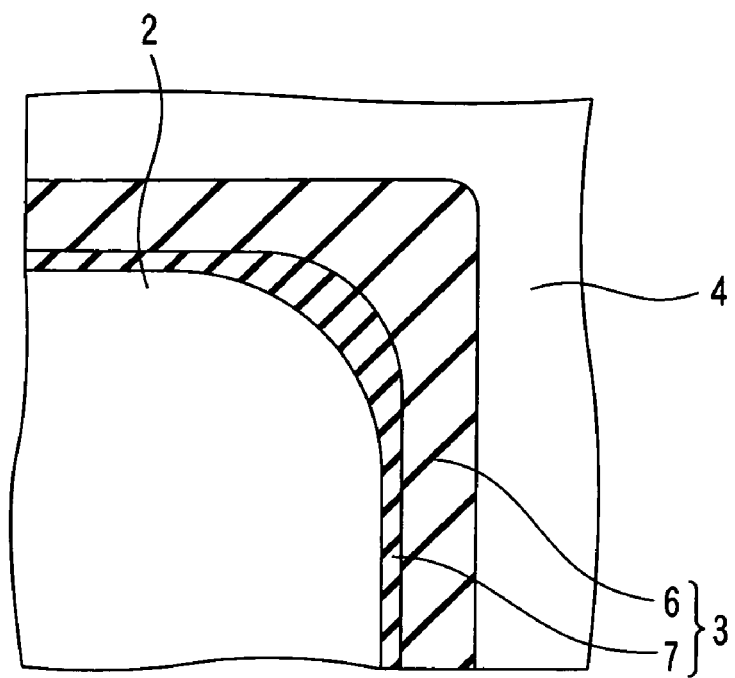
FIG. 11 shows an enlarged sectional view of the channel edge portion of the semiconductor device of the present invention, and shows a diagram of a second constitution of the gate insulating film.

The structure in the vicinity of the edge, schematically shown in FIG. 11, is considered next. A gate insulating film 3 having this structure includes a stacked structure of a gate insulating film 6 formed of a material having a permittivity higher than that of conventional silicon oxide, for example, a metal oxide such as hafnium dioxide ($HfO_2$), and a silicon oxide film 7. Moreover, the silicon oxide film 7 is formed to be thick only in the vicinity of the edge. Here, an equivalent oxide thickness obtained by dividing a product of a geometric thickness and the permittivity of silicon oxide by the permittivity of the material is more essential than the geometric film thickness with respect to the value of the electric field. The use of a high-permittivity material such as a metal oxide in the insulating film is effective in suppressing a tunnel current flowing through the gate insulating film, while raising the capacitive coupling between the channel region and the gate electrode. However, when the whole gate insulating film is formed of a high-permittivity material such as a metal oxide, the gate insulating film needs to be formed to be extremely thicker only in the vicinity of the edge, in order to reduce the electric field in the gate insulating film in the vicinity of the edge in the structure schematically shown in FIG. 10.

On the other hand, the structure schematically shown in FIG. 11 includes a material having a comparatively small permittivity, such as silicon oxide. When the thickness of the material is slightly changed, the above-described equivalent oxide thickness can be greatly changed. Therefore, when the thickness of the material having a small permittivity in the vicinity of the edge is slightly increased, it is possible to largely reduce the electric field in the gate insulating film in the vicinity of the edge. That is, when the gate insulating film is formed of a stacked layer of an insulating film such as a metal oxide and an insulating film such as silicon oxide, a tunnel current flowing through the gate insulating film is suppressed, while the capacitive coupling between the channel region and the gate electrode is increased. Moreover, the electric field in the gate insulating film is also easily reduced.

Moreover, in the gate insulating film structure of the stacked layer schematically shown in FIG. 11, the channel is brought into direct contact with silicon oxide. As compared with a case where the high-permittivity material like metal oxide is brought into direct contact with the channel, an interface between the gate insulating film and the channel is made satisfactory. That is, there is obtained another advantage that interface states are reduced.

Furthermore, when silicon oxynitride is used in the layer on the channel side in the stacked-layer insulating film schematically shown in FIG. 11, another advantage is obtained in that diffusion of impurities in the gate electrode into the substrate is suppressed in a case where the gate electrode is formed of polycrystalline silicon containing impurities.

Figure 12:
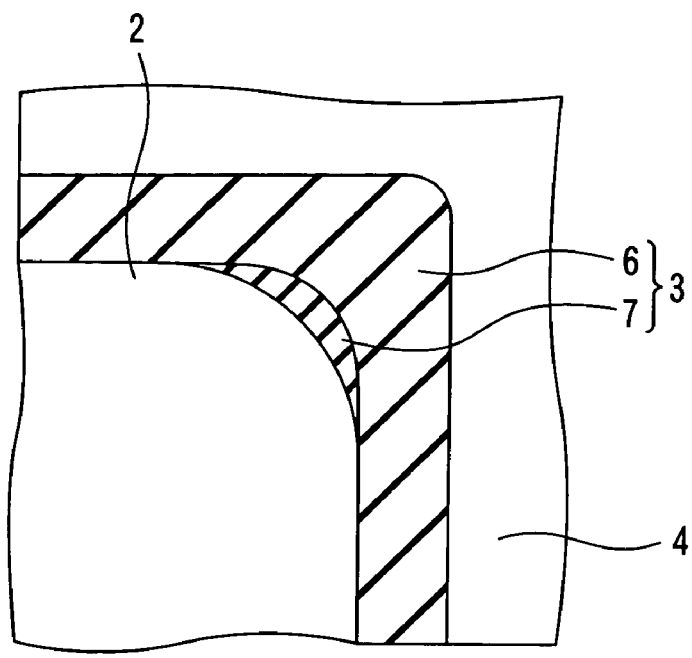
FIG. 12 shows an enlarged sectional view of the channel edge portion of the semiconductor device of the present invention, and shows a diagram of a third constitution of the gate insulating film.

Additionally, instead of forming the whole gate insulating film into the stacked layer as schematically shown in FIG. 11, a gate insulating film 3 may be a stacked layer of a gate insulating film 6 formed of a high-permittivity material such as metal oxide, and a gate insulating film 7 formed of silicon oxide only in the vicinity of the edge as schematically shown in a section in FIG. 12. In this case, a total equivalent oxide thickness of the gate insulating film is reduced in a portion other than the vicinity of the edge as compared with a case where the whole gate insulating film is formed into a stacked-layer film. This means that the capacitive coupling between the channel region and the gate electrode is strengthened. Therefore, another advantage can be obtained in that the controllability of the gate electrode with respect to the potential of the channel region is enhanced, the short channel effect is more effectively suppressed, and a current driving capability is further enhanced.

Figure 13:
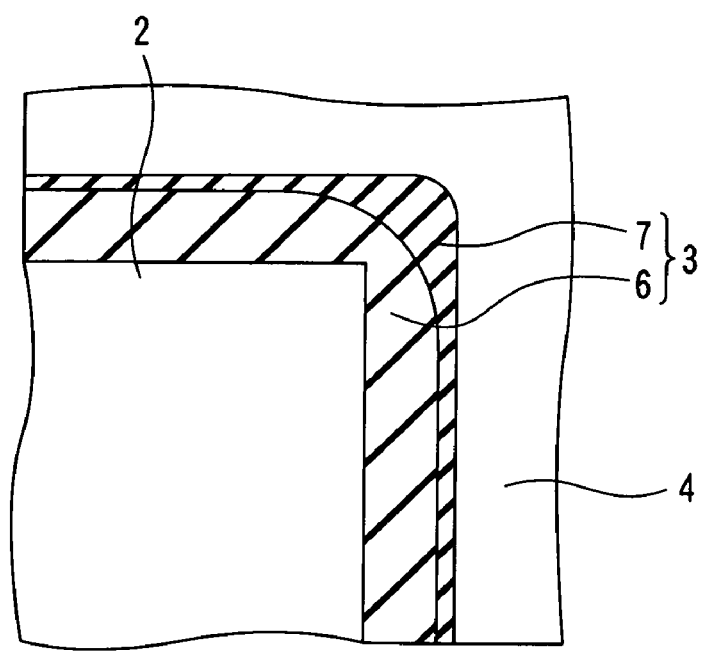
FIG. 13 shows an enlarged sectional view of the channel edge portion of the semiconductor device of the present invention, and shows a diagram of a fourth constitution of the gate insulating film.

Next, a structure schematically shown in FIG. 13 is considered. FIG. 13 is a vertical cross section of the vicinity of edge, taken in a direction perpendicular to a main direction of a current which flows through the channel. A gate insulating film 3 structured as shown includes a stacked-layer structure of a gate insulating film 6 formed of metal oxide such as $HfO_2$, and a silicon oxide film 7. Moreover, the silicon oxide film 7 is formed to be thick only in the vicinity of the edge. It is to be noted that $HfO_2$ has a high permittivity as compared with conventional silicon oxide.

In the structure schematically shown in FIG. 11, a film having a higher permittivity exists on a gate electrode side, and a film having a lower permittivity exists on a channel side among films constituting a stacked-layer insulating film. On the other hand, in the above-described structure, a film having a higher permittivity exists on the channel side, and a film having a lower permittivity exists on the gate electrode side. In general, a product of a vertical component of an electric field and a permittivity is continuous in an interface between different insulators. Therefore, an electric field in an insulator having a higher permittivity is weaker than that in an insulator having a lower permittivity. Therefore, in this structure, the electric field in the gate insulating film in the vicinity of the edge is further effectively suppressed.

Moreover, when silicon oxynitride is used in the layer on the gate electrode side in the stacked-layer insulating film of FIG. 13, another advantage is obtained in that diffusion of impurities in the gate electrode into the substrate is suppressed in a case where the gate electrode is formed of polycrystalline silicon containing impurities.

Figure 14:
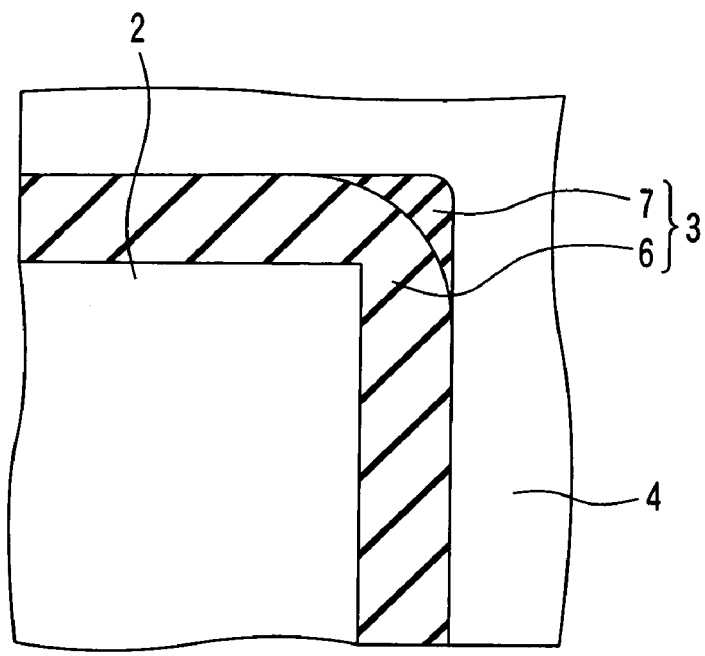
FIG. 14 shows an enlarged sectional view of the channel edge portion of the semiconductor device of the present invention, and shows a diagram of a fifth constitution of the gate insulating film.

Furthermore, instead of forming the whole gate insulating film into a stacked layer as shown in FIG. 13, a gate insulating film 3 may be a stacked layer of a gate insulating film 6 formed of a high-permittivity material such as a metal oxide, and a gate insulating film 7 formed of silicon oxide only in the vicinity of the edge as shown in FIG. 14. In this case, a total equivalent oxide thickness of the gate insulating film is reduced in a portion other than the vicinity of the edge as compared with the whole gate insulating film formed into the stacked-layer film. This means that the capacitive coupling between the channel region and the gate electrode is strengthened. Therefore, another advantage can be obtained in that controllability of the gate electrode with respect to a potential of the channel region is enhanced, a short channel effect is more effectively suppressed, and a current driving capability is further enhanced.

Figure 15:
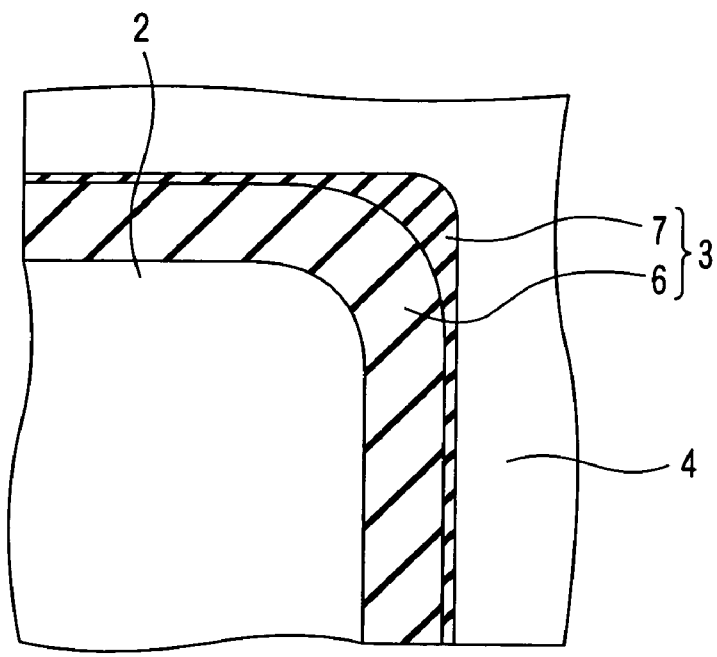
FIG. 15 shows an enlarged sectional view of the channel edge portion of the semiconductor device of the present invention, and shows a diagram of a sixth constitution of the gate insulating film.

Moreover, the edge of the semiconductor region 2 in which the channel is formed does not have to be a corner as shown in FIG. 13 or 14, and may be a curved face as shown in FIG. 15. When the edge is formed into the curved face as shown in FIG. 15, the gate insulating film in the vicinity of the edge becomes thick, and therefore the electric field is further reduced.

Figure 16:
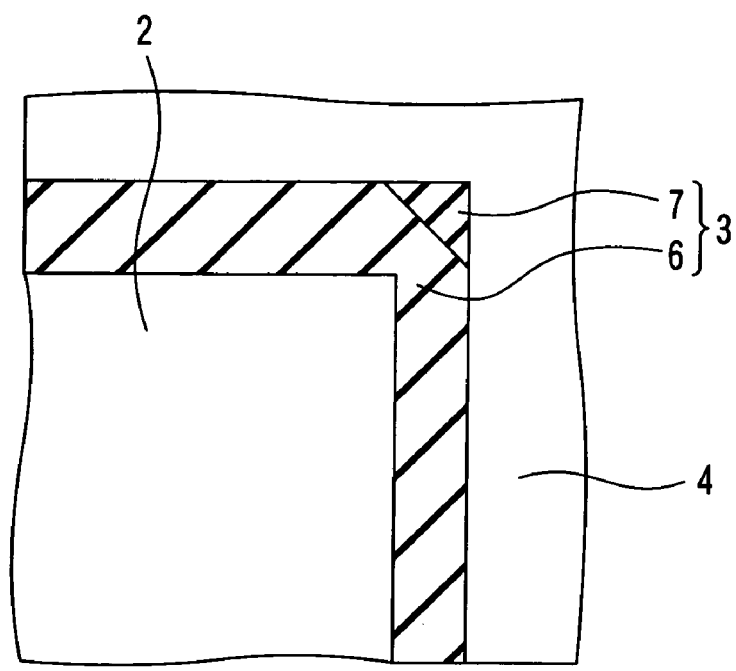
FIG. 16 is a sectional view showing a first gate insulating film structure of an element for use in simulation.
Figure 17:
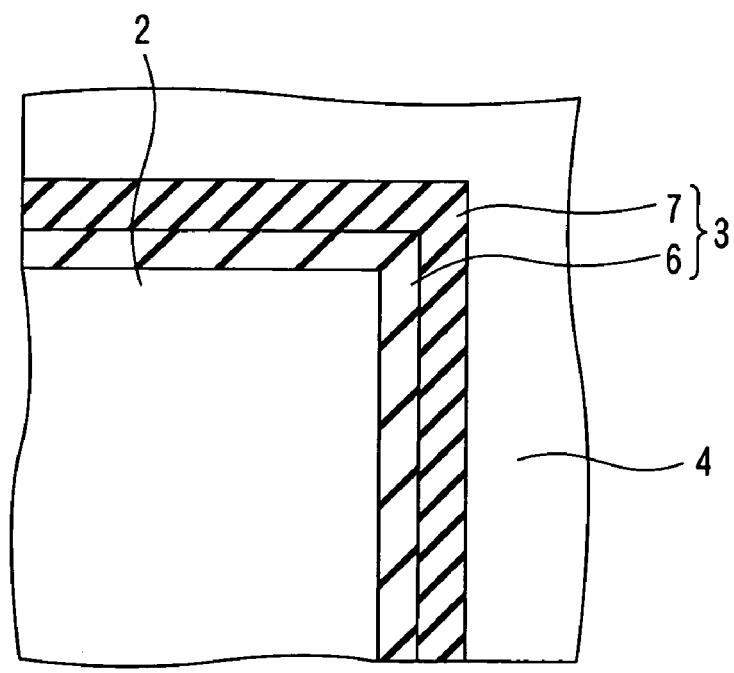
FIG. 17 is a sectional view showing a second gate insulating film structure of the element for use in the simulation.
Figure 18:
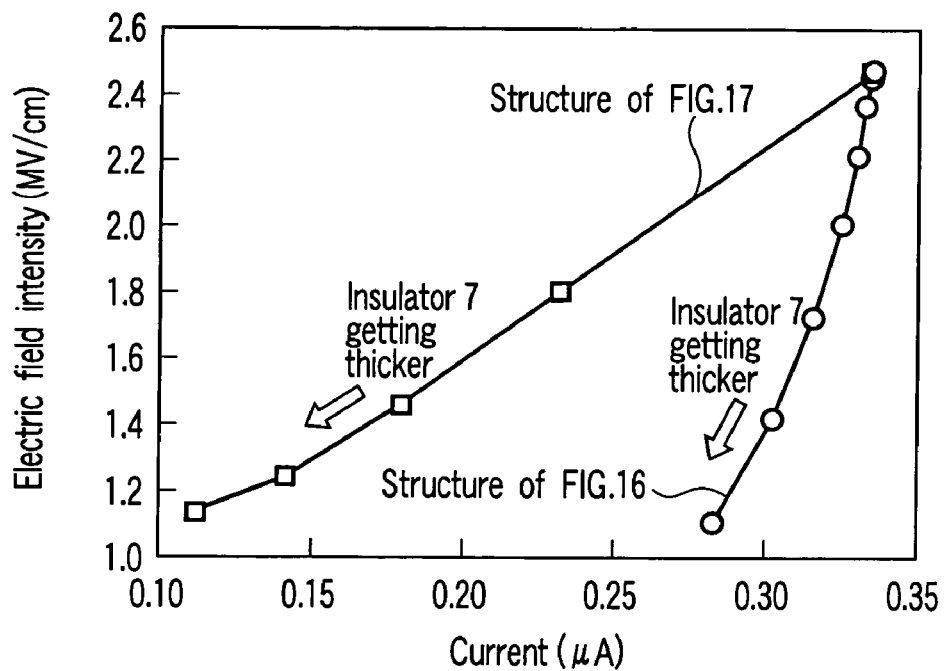
FIG. 18 is a characteristic diagram obtained by the simulation using the element having a structure of FIGS. 16 and 17.

Two schematic sectional views of the vicinity of the edge shown in FIGS. 16 and 17 are considered in a GAA type field-effect transistor shown in FIG. 2. FIG. 16 shows a case where a gate insulating film is formed into a stacked layer of a gate insulating film 6 (relative permittivity is k=19.5) formed of a metal oxide or the like, and a silicon oxide film 7 (relative permittivity is k=3.9) only in the vicinity of the edge. FIG. 17 shows a case where a whole gate insulating film is formed into a stacked layer of a gate insulating film 6 (relative permittivity is k=19.5) formed of metal oxide or the like, and a silicon oxide film 7 (relative permittivity is k=3.9). With respect to these two cases, the electric field intensity of the gate insulating film 3 in the vicinity of the edge, and a current value flowing through the element were checked by simulation, assuming a gate potential=0.6 V, drain potential=0.6 V, source potential=0 V. Results are shown in FIG. 18.

In either of the structures shown in FIGS. 16 and 17, when the silicon oxide film 7 is made thicker, the electric field intensity in the insulating film decreases. Moreover, the current value largely decreases in the structure shown in FIG. 17, whereas the value only slightly decreases in the structure shown in FIG. 16. Therefore, it is seen that degradation in current driving capability is greatly suppressed while reducing the electric field in the gate insulating film, when the gate insulating film is formed into the stacked layer only in the vicinity of the edge as shown in FIGS. 11 to 15, or a film having a lower permittivity is formed to be thick only in the vicinity of the edge in the stacked-layer gate insulating film.

Figure 19:
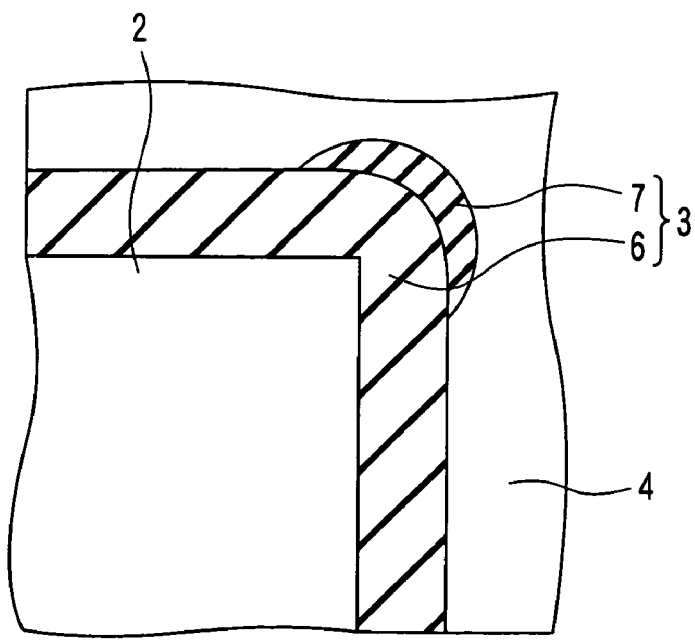
FIG. 19 shows an enlarged sectional view of the channel edge portion of the semiconductor device of the present invention, and shows a diagram of a seventh constitution of the gate insulating film.

Moreover, when the sectional structure in the vicinity of the edge is formed as shown in FIGS. 10 to 17, the gate insulating film is included in a rectangular region obtained by extending the interface between the gate insulating film 3 and the gate electrode 4 in a region other than the vicinity of the edge. This is not essential. For example, the gate insulating film 3 may not fall within this rectangular region as schematically shown in a section in the vicinity of the edge in FIG. 19. In the structure shown in FIG. 19, since the gate insulating film in the vicinity of the edge is further thicker than that of the other region, the electric field in the gate insulating film in the vicinity of the edge is further effectively reduced.

It is to be noted that in the above description, the stacked-layer gate insulating film is a stacked layer of two layers, but this is not essential. For example, as shown in FIGS. 20 and 21, a stacked layer of three or more layers may be formed. FIGS. 20 and 21 show a stacked-layer structure of a silicon oxide film 7/gate insulating film 6 of a metal oxide or the like/silicon oxide film 7. In this case, another advantage is obtained in that the intense electric field generated in the gate insulating film 3 is also reduced in the vicinity of the edge of a source/drain end of a gate electrode. It is to be noted that in FIG. 20, the silicon oxide film 7 in the vicinity of the gate electrode is formed to have a uniform thickness. In FIG. 21, the silicon oxide film 7 in the vicinity of a semiconductor region in which the channel is formed is formed into a uniform thickness. However, this is not essential. For example, even if the silicon oxide film 7 does not have a uniform thickness as shown in FIG. 22, a similar effect is obtained. In embodiments shown in FIGS. 20 to 22, among the gate insulating films, a layer close to the gate electrode is formed of the same material as that of a layer in the vicinity of the semiconductor region in which the channel is formed, but this is not essential, and the layers may be formed of different materials.

As described above, in the field-effect transistor of the present invention, the gate insulating film is formed to be thick only in the vicinity of the edge of the channel forming region, or a film having a small permittivity among the films constituting a stacked layer is formed to be thick only in the vicinity of the edge in the gate insulating film of the stacked-layer structure. In this case, it is possible to reduce the electric field intensity in the gate insulating film in the vicinity of the edge without involving degradation of capacitive coupling formed between the channel region and the gate electrode. As a result, the short channel effect is effectively suppressed, further high current driving capability is realized, and high reliability is obtained. Therefore, a high-performance element capable of operating at a high speed and having high reliability and performance is provided.

Embodiments of the present invention will be described hereinafter in detail. It is to be noted that the present invention is not limited to the following embodiments, and can be variously modified and used.

FIRST EMBODIMENT

FIG. 23 is a schematic diagram of a tri-gate type field-effect transistor of the present invention. The present embodiment will be described in accordance with an N-channel field-effect transistor. When a conductivity type of a semiconductor region is inverted, this embodiment is applicable to a P-channel field-effect transistor as well. When using a method in which impurities are injected only into a specific region in a substrate using a process such as photo lithography, a complementary field-effect transistor can be formed in the same manner, and a similar effect is obtained.

This field-effect transistor is of a tri-gate type, and a gate insulating film 3 is formed as a stacked-layer of a high-permittivity film 6 of a metal oxide or the like, and low-permittivity films 7 of silicon oxide or the like in the vicinity of the edge of a plate of semiconductor region 2 in which the channel is formed. Therefore, for the above-described reason, an electric field in the gate insulating film is reduced as compared with a semiconductor device having a conventional structure shown in FIG. 1. As a result, a high-performance semiconductor device is realized that is capable of operating at a sufficiently high speed and having high reliability and performance.

Moreover, this field-effect transistor is formed on a semiconductor substrate 11 having a silicon-on-insulator (SOI) structure. The semiconductor substrate 11 is a stacked-layer substrate constituted of a buried insulating film 9 formed on a support substrate 8, and a P-type SOI layer 10 formed on the insulating film. The SOI layer 10 is worked into a plate (fin) form, and the semiconductor region 2 is constituted in which a source/drain and channel are formed.

An N-channel region is formed in a middle portion of the plate-like semiconductor region 2 by B ion implantation. The insulating film 6 having permittivity higher than that of silicon oxide, such as a metal oxide or the like, forms the gate insulating film 3 on a portion of the semiconductor region 2 in which the channel is formed. Furthermore, the gate insulating film 3 has a silicon oxide insulating film 7 formed on the insulating film 6 only in the vicinity of the edge in the channel forming portion of the semiconductor region 2. That is, the gate insulating film 3 is formed of the insulating film 6, and the insulating film 7 partially formed in the vicinity of the edge.

On the gate insulating film 3, a refractory metal is deposited to form a band of gate electrode 4. A source/drain region 5 is formed by As ion implantation in such a manner as to hold a channel forming portion (or a gate electrode 4) in the semiconductor region 2. It is to be noted that in this figure, a wiring metal, a contact region for connecting the wiring metal to the gate electrode 4 and source/drain region 5, an interlayer insulating film and the like are omitted.

Next, a method of manufacturing the field-effect transistor will be described hereinafter.

Figure 24:
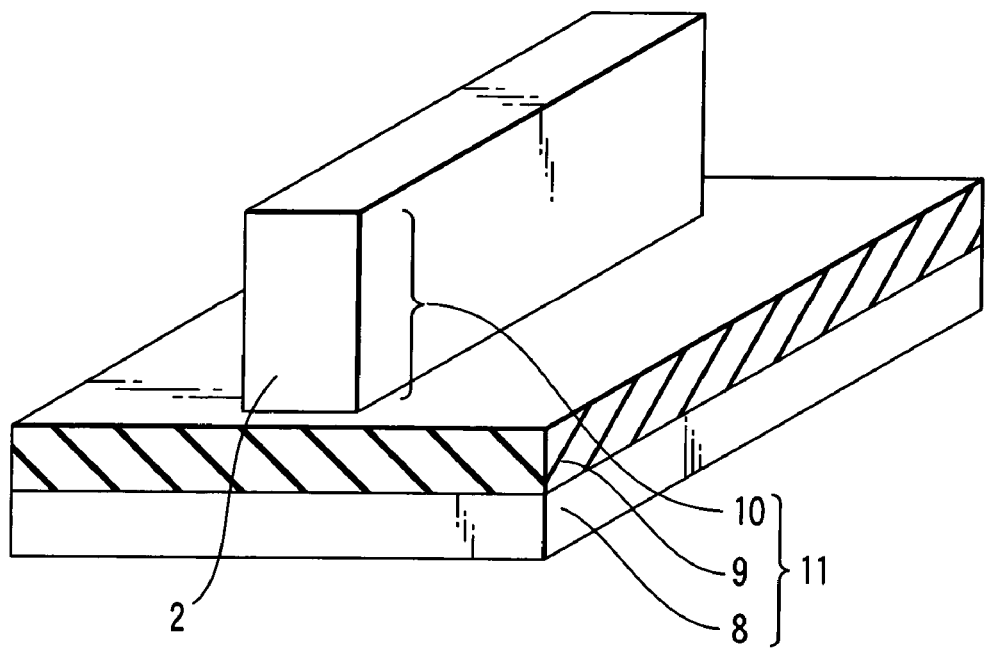
FIGS. 24 to 28 are schematic perspective views showing manufacturing steps of the field-effect transistor according to the first embodiment in a stepwise manner.

First, an SOI substrate 11 is prepared, for example, boron (B) ions are implanted with respect to an SOI layer 10 at 100 keV, $2.0 \times 10^{12}$ cm$^{-2}$, and thereafter a thermal treatment is performed at 1050° C. for 30 seconds. Subsequently, as shown in FIG. 24, the SOI layer 10 is subjected to anisotropic etching such as reactive ion etching (RIE), and accordingly a plate-like semiconductor region 2 is formed.

Figure 25:
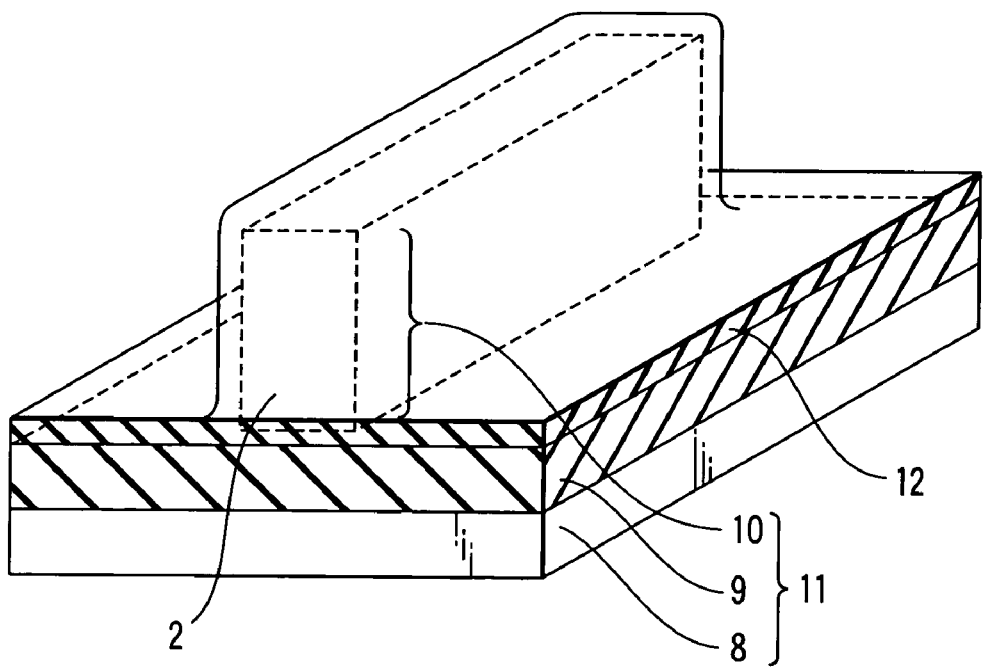
Figure 26:
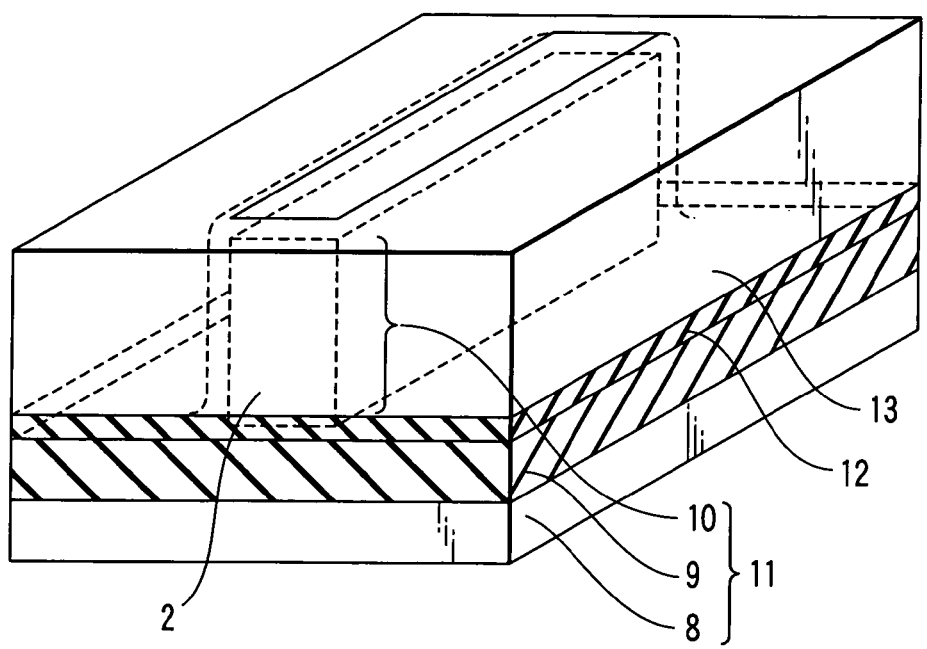
Figure 27:
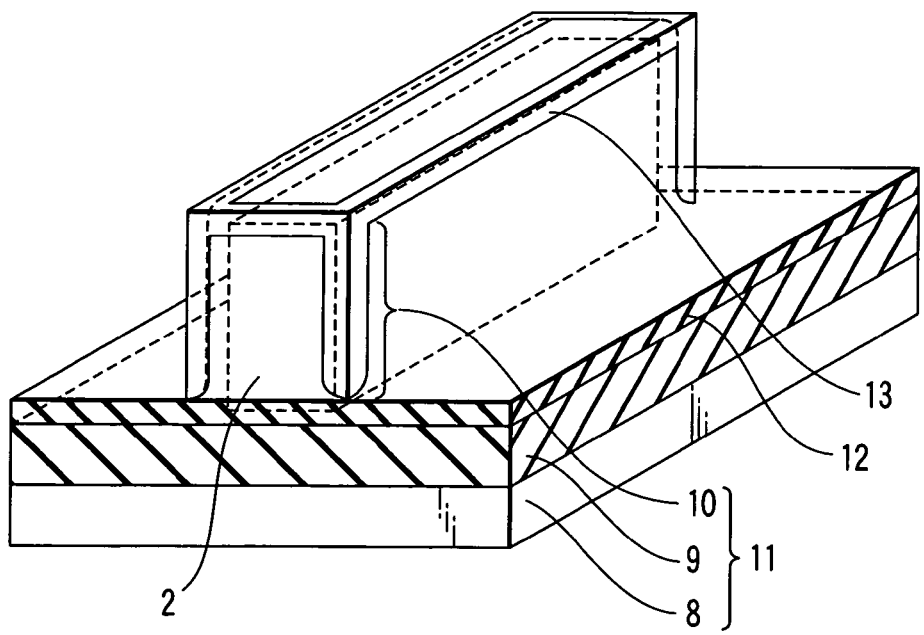

Next, as shown in FIG. 25, for example, an HfO$_2$ film 12 having a thickness of 5 nm is formed on the whole surface of the SOI substrate 11 by chemical vapor deposition (CVD) or the like. Subsequently, as shown in FIG. 26, for example, a silicon oxide film 13 is deposited on the whole surface by the CVD process or the like, and the surface is flatted by chemical mechanical polishing (CMP) or the like. Subsequently, as shown in FIG. 27, the silicon oxide film 13 is worked, for example, by an RIE process, and is left only in the vicinity of the edge of the semiconductor region 2.

Figure 28:
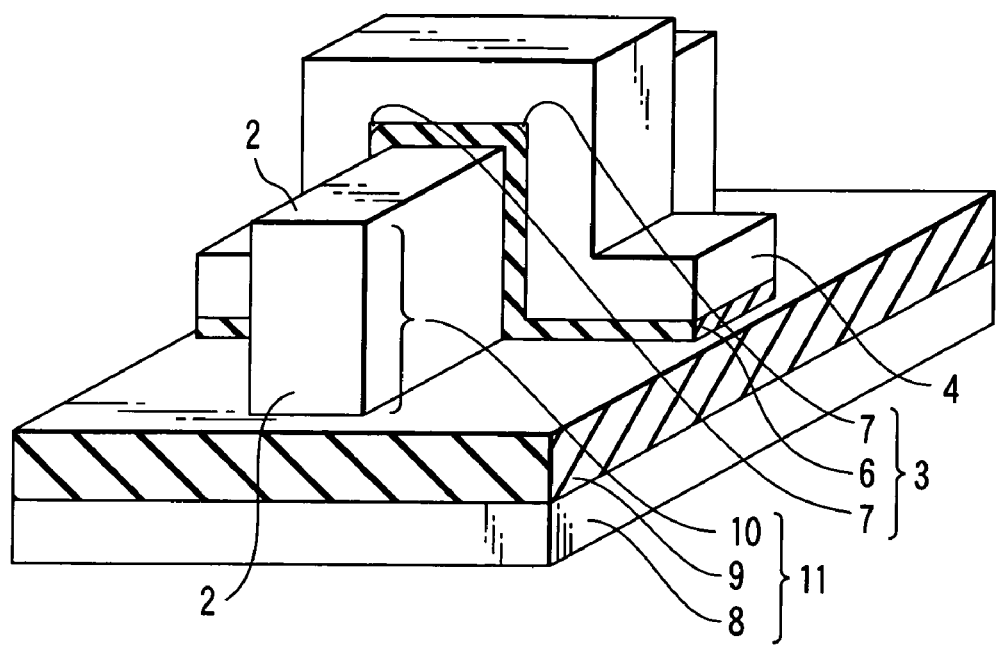

Next, as shown in FIG. 28, for example, a refractory metal film of tungsten or the like having a thickness of 100 nm is deposited on the HfO$_2$ film 12 and the silicon oxide film 13 by the CVD process. Subsequently, this refractory metal film is worked by anisotropic etching such as the RIE process to form the gate electrode 4. Subsequently, the HfO$_2$ film 12 and the silicon oxide film 13 are worked by anisotropic etching such as the RIE process to form a gate insulating film 3 constituted of a gate insulating film 6 of metal oxide, and a silicon oxide film 7.

Next, for example, arsenic (As) ions are implanted in the semiconductor region 2 at 30 keV and $5.0 \times 10^{15}$ cm$^{-2}$. Subsequently, the source/drain region 5 is formed by a thermal step, and the field-effect transistor shown in FIG. 23 is formed. Thereafter, the semiconductor device is formed through an interlayer insulating film forming step, contact hole making step, wiring step and the like.

The present embodiment has been described in accordance with the example of the N-type field-effect transistor. When the conductivity type of the semiconductor region is inverted, the present embodiment is also applicable to a P-type field-effect transistor. When a conductivity type inverted region is formed in a specific region in the substrate using a photo lithography process or the like, a complementary field-effect transistor can be formed in the above-described method. The present invention is usable in a semiconductor device that includes a transistor as a part.

Moreover, the above-described method of forming the field-effect transistor is usable in forming a field-effect transistor as a part of a semiconductor device including other active elements such as a bipolar transistor and single electron transistor, passive elements such as a resistor, inductor, and capacitor, a ferroelectric element, or a magnetic element. The method is similarly applicable to a case where the field-effect transistor is formed as a part of an opto-electrical integrated circuit (OEIC) or a micro-electro-mechanical system (MEMS).

Moreover, the present embodiment has been described in accordance with an example of a tri-gate type field-effect transistor, but a similar effect is obtained also with respect to a mesa-isolation SOI element, gate all around type element, pi-gate element, omega-gate element, vertical structure element and the like.

Furthermore, in the present embodiment, As is used as the impurity for forming an N-type semiconductor layer, and B is used as the impurity for forming a P-type semiconductor layer, but another element of the group V may be used in the N-type semiconductor layer, and another element of the group III may be used in the P-type semiconductor layer. The impurity elements of the groups III and V may be introduced in the form of compounds including the elements.

Additionally, in the present embodiment, the impurities are introduced using ion implantation. In addition to ion implantation, for example, processes such as solid phase diffusion and vapor phase diffusion may be used. A method of depositing or growing a semiconductor containing the impurities may also be used.

Moreover, the RIE process is used in forming the plate-like semiconductor region 2 in the present embodiment, but, for example, an immersing method in a solution having anisotropy, such as an alkali solution, may be used.

Furthermore, in the present embodiment, a plate-like region (well) is formed, and the impurities for adjusting impurity concentration of the channel region are not introduced, but impurities may be introduced into the channel region anew in a step separate from an impurity introducing step for forming the well. Thus, a threshold voltage is easily set to a desired value.

Additionally, in the present embodiment, an element having a single drain structure has been described, but an element of a structure other than the single drain structure may be constructed, such as an extension structure, lightly-doped source/drain (LDD) structure, and graded diffused source/drain (GDD). An element having a halo structure, pocket structure, or elevated source/drain structure may be used. By the use of these structures, the short channel effect is effectively suppressed.

Moreover, in the present embodiment, a source/drain region is formed after working a gate electrode or a gate insulating film, but this order is not essential, and a reverse order may be performed. A thermal treatment is sometimes unfavorable depending on the material of the gate electrode or the gate insulating film. In this case, heating steps of introducing the impurities into the source/drain region or activating the region may be performed prior to the working of the gate electrode or the gate insulating film.

Furthermore, in the present embodiment, the thickness of the metal for forming the gate electrode is smaller than that of the semiconductor region in which the channel is formed, but this is not essential, and the thickness may be set to be equal to or larger than that of the semiconductor region in which the channel is formed. The material may be deposited to be sufficiently thick to flatten the surface before the working. In this case, since the surface is flat in the subsequent lithography step, resolution of lithography is enhanced. Alternatively, there is an advantage that the required depth of focus may be small.

Additionally, in the present embodiment, a refractory metal is used in the gate electrode, but the gate electrode may be formed of a semiconductor such as polycrystalline silicon, single crystal silicon, and amorphous silicon, a metal which does not necessarily have a refractory point, a compound containing the metal, and a stacked layer. When the gate electrode is formed of the metal or the metal-containing compound, gate resistivity is reduced, and therefore an element offering high-speed operation is obtained. When the gate is formed of the metal, an oxidation reaction does not easily proceed. Therefore, there is an advantage that controllability of the interface between the gate insulating film and the gate electrode is satisfactory. When a semiconductor such as polycrystalline silicon is used in at least a part of the gate electrode, there is another advantage in that a work function is easily controlled, and the threshold voltage of the element is easily adjusted.

Moreover, in the present embodiment, the gate electrode is formed by a method of depositing a gate electrode material and thereafter performing anisotropic etching, but the gate electrode may be formed using a burying method such as a damascene process. When the source/drain region is formed before forming the gate electrode, the source/drain region and the gate electrode are preferably formed in a self-aligning manner using the damascene process.

Furthermore, in the present embodiment, a length of an upper part of the gate electrode measured in a main direction of the current flowing through the element is equal to that of an upper part of the gate electrode, but this is not essential. For example, a shape like the letter "T" may be formed in which the length of the upper part of the gate electrode is larger than that of the lower part. In this case, another advantage is obtained in that the gate resistance can be reduced.

Moreover, the impurity concentration of the channel region may be set in such a manner that the semiconductor region in which the channel is formed is completely or partially depleted in an on-state of the element. When the region is set in such a manner as to be completely depleted, another advantage is obtained in that the impurity concentration of the channel region is reduced, therefore mobility is enhanced, a current driving capability is further improved, and a parasitic bipolar effect is inhibited.

Moreover, although not clearly described in the present embodiment, the metal layer for the wiring may be formed, for example, using a sputtering process, depositing process or the like. Selective growth of the metal, a damascene process or the like may be used. As the material of the wiring metal, metals such as Si-containing Al and copper (Cu) may be used. Especially, Cu is preferable because its resistivity is low.

Furthermore, in the present embodiment, after forming a semiconductor region in which the channel is formed, an $HfO_2$ film is deposited. However, a step of oxidizing the semiconductor region in which the channel is formed to round the edge may be performed prior to the depositing. Thus, the electric field in the gate insulating film in the vicinity of the edge is further reduced.

Additionally, in the present embodiment, a silicide process has not been mentioned, but a silicide layer may be formed on the source/drain region. A method of depositing or growing a metal-containing layer on the source/drain region may be used. In this method, resistance of the source/drain region is reduced. When the gate electrode is formed of polycrystalline silicon or the like, the gate electrode may be formed into silicide to reduce the gate resistance.

Moreover, in the present embodiment, the upper part of the gate electrode has a structure in which the electrode is exposed, but insulators such as silicon oxide, silicon nitride, and silicon oxynitride may be disposed in the upper part. Especially, the gate electrode is formed of a metal-containing material, and the silicide layer is formed on the source/drain region. In this case, the gate electrode needs to be protected midway in the manufacturing steps, and it is essential to dispose protective materials such as silicon oxide, silicon nitride, and silicon oxynitride in the upper part of the gate electrode.

Furthermore, in the present embodiment, a gate sidewall has not been mentioned, but the sidewall may be disposed on the gate electrode. Especially, when the gate sidewall is formed of a high-permittivity material, the electric field in the gate insulating film in the vicinity of the gate electrode lower end corner is reduced, and reliability of the gate insulating film is enhanced as described in Jpn. Pat. Appln. KOKAI Publication No. 2003-209247 (by the same inventor as that of the present application).

Additionally, in the present embodiment, the gate insulating film of a region other than the vicinity of the edge is formed into a single-layer structure, but this is not inevitable, and a stacked-layer structure may be formed. Especially, when a film of silicon oxide, silicon nitride, silicon oxynitride or the like is disposed in the vicinity of the interface with the substrate, mobility of a carrier is enhanced, and the current driving capability is further improved.

It is to be noted that charges and interfacial states at the interface between the insulating film and the semiconductor substrate or in the insulating film are preferably small. Considering this, the use of silicon oxide is appropriate in a layer brought into contact with the semiconductor substrate. On the other hand, from a viewpoint of prevention of diffusion of impurities in the channel region in a case where the semiconductor is used in the gate electrode, the use of silicon nitride or silicon oxynitride is appropriate. This is because the diffusion of the impurities is inhibited by the presence of nitrogen.

Moreover, for example, these films may be formed using a method of exposing the films to an oxygen gas in a high temperature, or a deposition method. The films may be exposed to an oxygen gas in an excited state which does not involve any temperature rise. In the method of exposing the films to the oxygen gas having the excited state which does not involve any temperature rise, there is an advantage in that fluctuation of impurity concentration distribution in the channel region by the diffusion is inhibited. Furthermore, when silicon oxynitride is used, first a silicon oxide film is formed, and thereafter the film may be exposed to a nitrogen-containing gas in a high temperature or in an excited state to thereby introduce nitrogen into the insulating film. Even in this case, by the use of the method of exposing the film to the nitrogen gas in the excited state which does not involve any temperature rise, the fluctuation of the impurity concentration distribution in the channel region caused by diffusion is inhibited.

Furthermore, in the present embodiment, the $HfO_2$ film formed by the CVD process is used as the gate insulating film, but the gate insulating film for use may be formed of: an oxide of hafnium (Hf) having different valence; an oxide of another metal such as zirconium (Zr), titanium (Ti), scandium (Sc), yttrium (Y), tantalum (Ta), aluminum (Al), lanthanum (La), cerium (Ce), praseodymium (Pr), or lanthanoid-based element; a silicate material (a compound between a metal oxide and a silicon oxide) containing these elements or various other elements; an insulating film formed of these materials containing nitrogen; another high-permittivity film; an insulating film formed of a stacked layer of these materials or the like.

When nitrogen exists in the insulating film, there is an advantage in that crystallization and precipitation of a specific element are inhibited. When nitrogen exists in the insulating film, and impurity-containing polycrystalline silicon is used as the gate electrode, there is another advantage in that the impurities are inhibited from being diffused in the substrate. A method of forming the insulating film is not limited to the CVD process, and another method may be used such as an evaporation process, sputtering process, and epitaxial growth process. When oxide of a certain material is used as the insulating film, a method may be used in which first the film of the material is formed, and then oxidized.

Moreover, the thickness of the insulating film or the like forming the gate insulating film is not limited to the value in the present embodiment. Furthermore, the gate insulating film in the region other than the vicinity of the edge is set in such a manner as to have a uniform thickness, but this is not essential.

Furthermore, in the present embodiment, the elements are isolated using a mesa-type element isolation process, but the elements may be isolated using another method such as a local oxidation process and a trench isolation process.

Additionally, in the present embodiment, the element is formed on the SOI substrate, but may be formed on a usual bulk substrate. When the element is formed on the SOI substrate, there is an advantage in that a buried insulating film may be used as an etching stopper in etching, when forming the semiconductor region in which the channel is formed. When the element is formed on the bulk substrate, a terminal for controlling the potential of a well region through the substrate can be formed. Therefore, for example, there is an advantage in that a parasitic bipolar effect is effectively suppressed.

Moreover, in the present embodiment, post oxidation after forming the gate electrode has not been mentioned, but a post oxidation step may be performed as long as the gate electrode or gate insulating film material or the like is suitable for post oxidation. The step is not necessarily limited to post oxidation, and a process to round the corner of the gate electrode lower end may be performed by a method such as chemical treatment or exposure to a reactive gas. When these steps are possible, the electric field of the gate electrode lower end corner portion is accordingly reduced.

Furthermore, although not clearly described in the present embodiment, a silicon oxide film may be used as an interlayer insulating film, and a material other than silicon oxide, such as a low-permittivity material, may be used in the interlayer insulating film. When the permittivity of the interlayer insulating film is lowered, the parasitic capacitance of the element is reduced, and therefore a high-speed operation of the element can be achieved.

Additionally, although not clearly described in the present embodiment, as to a contact hole, a self-aligning contact may be formed. By the use of a self-aligning contact, an area of the element can be reduced, and the degree of integration is improved.

Moreover, in the present embodiment, the gate insulating film on the source/drain region other than the region under the gate electrode is removed, but may be left without being removed. For example, when the source/drain region is formed by ion implantation after forming the gate electrode, and when the gate insulating film on the source/drain region is removed, a dose loss is prevented. When the source/drain region is formed into silicide, it is essential to remove the film. The removal method is not limited to an RIE process. For example, a chemical dry etching (CDE) process, wet treatment process or the like may be used.

Figure 29:
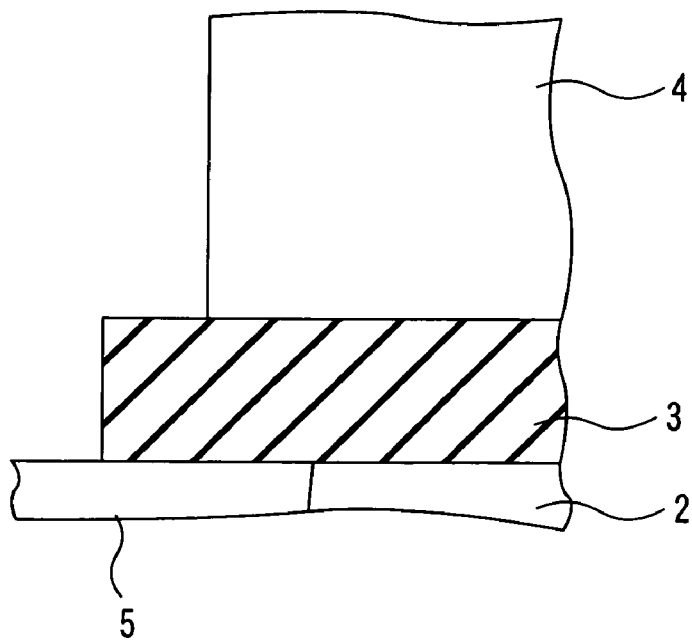
FIG. 29 is an enlarged sectional view of a gate insulating film end portion showing a modification of the field-effect transistor according to the first embodiment.

Furthermore, in the present embodiment, as shown in FIG. 23, the side face of the gate insulating film is worked in accordance with the gate electrode, but, for example, a portion around the lower end corner of the gate electrode may be worked in such a manner that the gate insulating film protrudes from the gate electrode as shown in FIG. 29. In this case, since the capacitive coupling between the source/drain region and the gate electrode is strengthened, resistance of the source/drain region is reduced, parasitic resistance is suppressed, and a higher-speed operation is possible. It is to be noted that FIG. 29 is an enlarged sectional view along a gate length direction, showing the vicinity of a boundary between a source (or drain) region 5 and a channel region 2.

Figure 30:
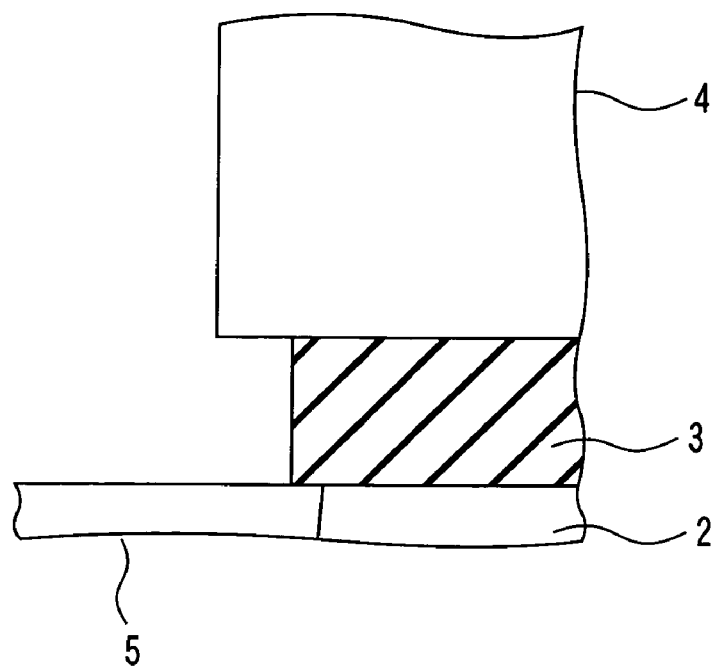
FIG. 30 is an enlarged sectional view of the gate insulating film end portion showing another modification of the field-effect transistor according to the first embodiment.

Additionally, as shown in FIG. 30, the gate insulating film may be worked in such a manner as to be dented inside the gate electrode. In this case, as described in the Jpn. Pat. Appln. KOKAI Publication No. 2003-209247, another advantage is obtained in that the electric field in the gate insulating film in the vicinity of the gate electrode lower end corner is reduced. Furthermore, a protruding length of the gate insulating film from the gate electrode (shown in FIG. 29), or a dented length inside the gate electrode (shown in FIG. 30) may be different with respect to a source side and a drain side of a single MOS device.

It is to be noted that in the present embodiment or the modification, the structure of the single transistor only has been described, but the embodiment is not limited to the single transistor. Even when the embodiment is applied to a plurality of transistors, needless to say, a similar effect is obtained.

SECOND EMBODIMENT

Next, another method of manufacturing a field-effect transistor of the present invention will be described.

Figure 31:
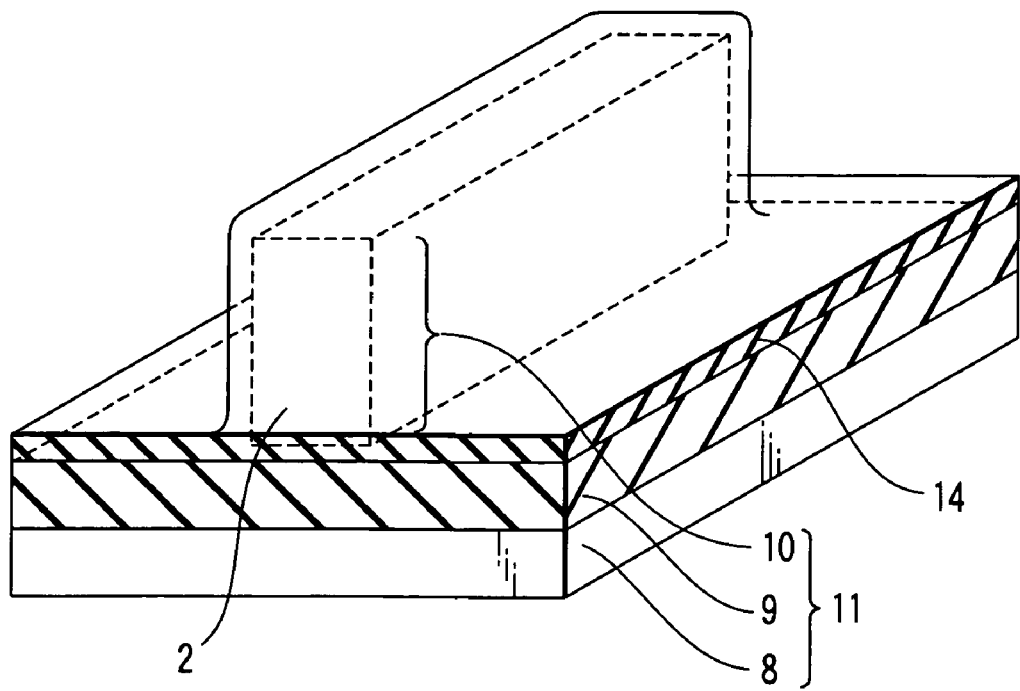
FIGS. 31 and 32 are schematic perspective views showing manufacturing steps of the field-effect transistor according to a second embodiment.

For example, by the use of a method such as a CVD process as shown in FIG. 31 subsequent to the step shown in FIG. 24 in the first embodiment, a hafnium silicate film 14 having a thickness of 5 nm and containing an excessive amount of silicon is formed.

Figure 32:
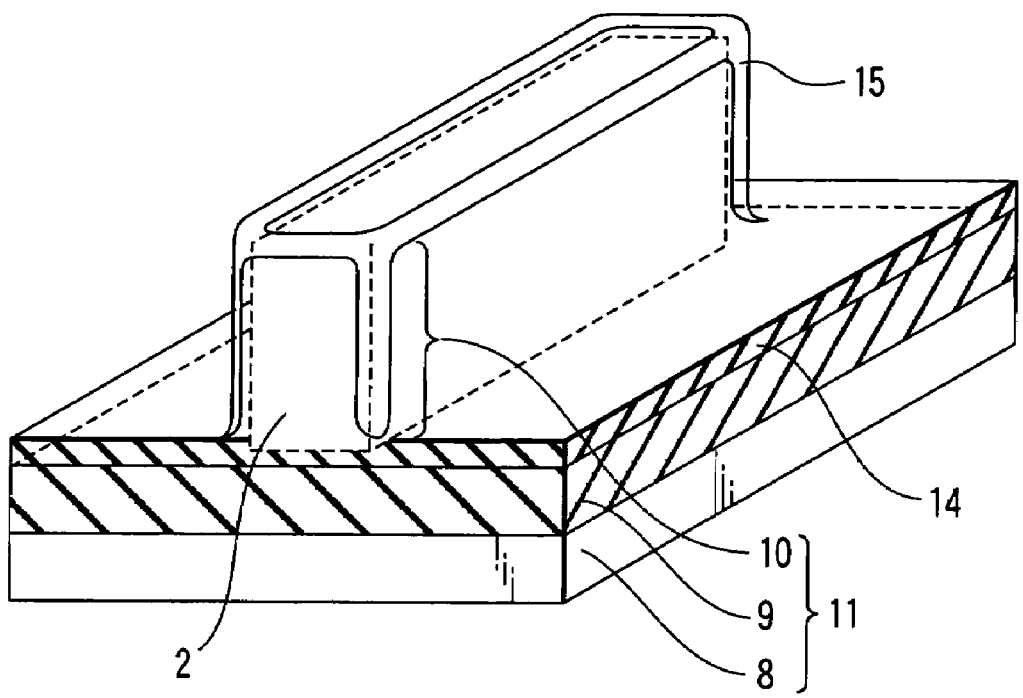

Next, as shown in FIG. 32, the hafnium silicate film 14 containing the excessive amount of silicon is oxidized. Then, silicon excessively contained in the hafnium silicate film 14 is oxidized, but oxidation is promoted in the vicinity of the edge, and a silicon oxide film 15 around the corresponding portion is formed to be thick. The subsequent steps are similar to those shown in and after FIG. 28 of the first embodiment.

When the element is formed by the method of the present embodiment, a region including a thick silicon oxide film is formed in the vicinity of the edge of a semiconductor region in which a channel is formed in a self-aligning manner. Also in the present embodiment, various modifications described in the first embodiment are possible, and a similar effect is obtained.

THIRD EMBODIMENT

Next, another method of manufacturing a field-effect transistor of the present invention will be described.

Figure 33:
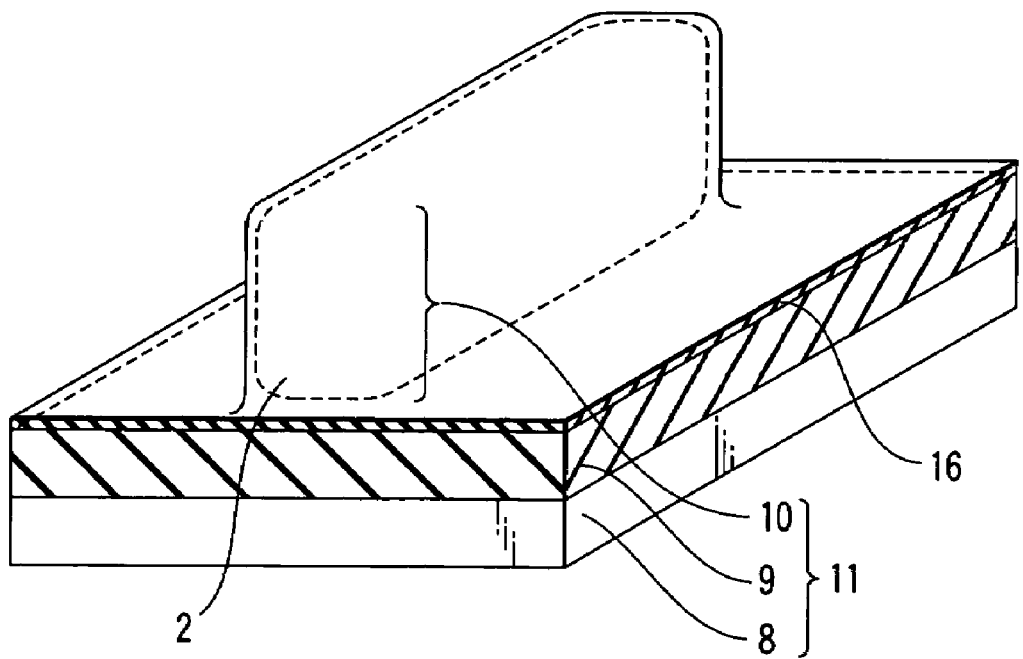
FIGS. 33 and 34 are schematic perspective views showing manufacturing steps of the field-effect transistor according to a third embodiment of the present invention.

Following the step shown in FIG. 24 in the first embodiment, as shown in FIG. 33, the surface of a semiconductor region 2 in which a channel is formed is oxidized. Then, since oxidation of the vicinity of edge is promoted, a silicon oxide film 16 is formed to be thick around the corresponding portion.

Figure 34:
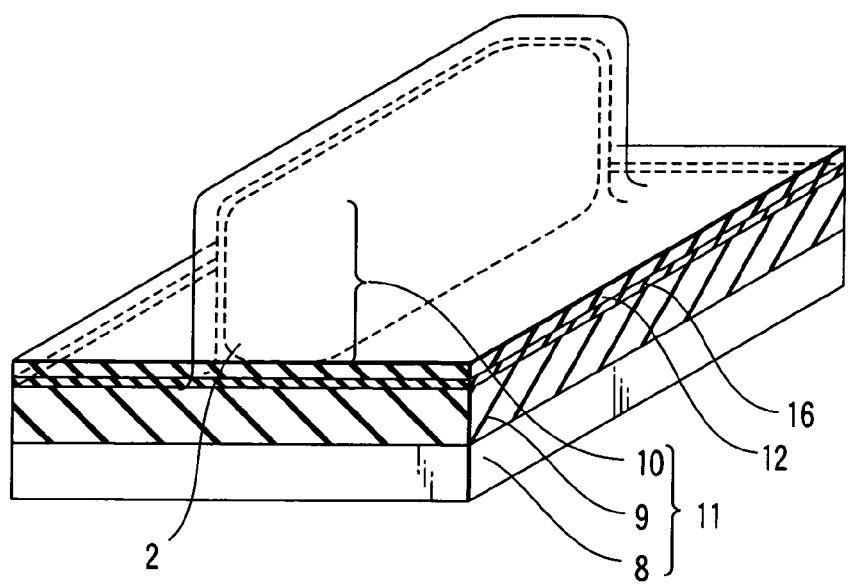

Next, as shown in FIG. 34, for example, by the use of a method such as a CVD process, for example, an $HfO_2$ film 12 having a thickness of 5 nm is formed. The subsequent steps are similar to those shown in and after FIG. 28 of the first embodiment.

When the element is formed by the method of the present embodiment, a region including a thick silicon oxide film is formed in the vicinity of the edge of a semiconductor region in which a channel is formed in a self-aligning manner. Also in the present embodiment, various modifications described in the first embodiment are possible, and a similar effect is obtained.

FOURTH EMBODIMENT

Next, a further method of manufacturing a field-effect transistor of the present invention will be described.

Figure 35:
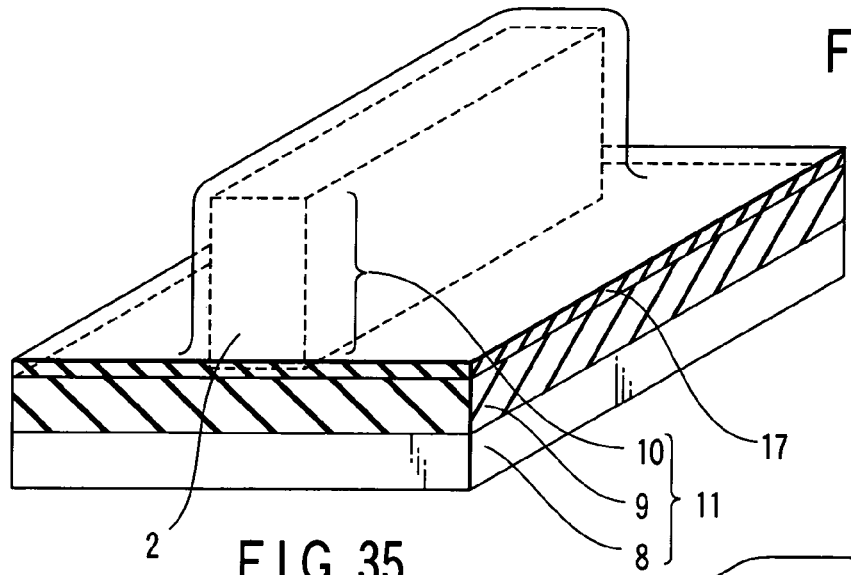
FIGS. 35 and 36 are schematic perspective views showing manufacturing steps of the field-effect transistor according to a fourth embodiment of the present invention.

Following the step shown in FIG. 24 in the first embodiment, for example, as shown in FIG. 35, by the use of a method such as a CVD process, a hafnium silicate film 17 having a thickness of 5 nm and containing an excessive amount of oxygen is formed.

Figure 36:
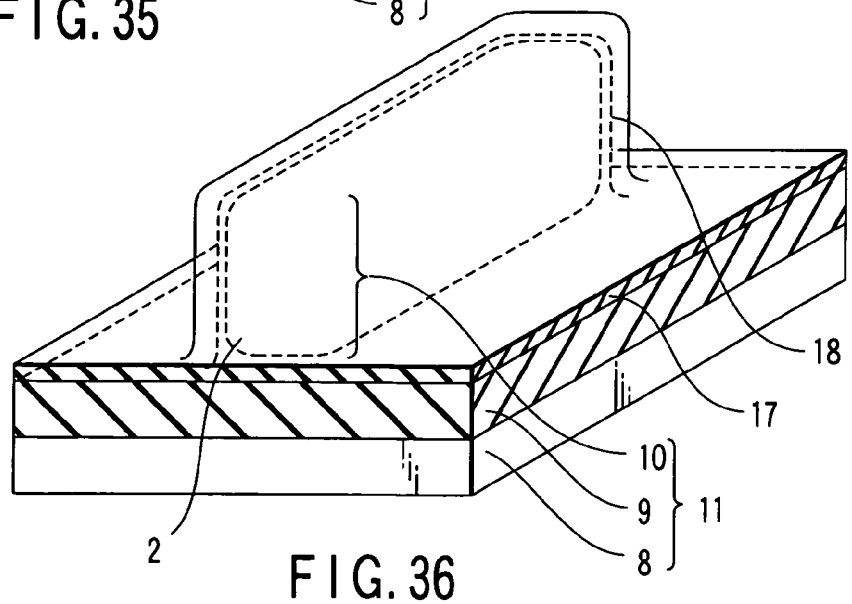

Next, as shown in FIG. 36, a heat treatment is applied to the whole substrate. Then, a semiconductor region 2 in which a channel is formed is oxidized by oxygen excessively contained in the hafnium silicate film 17, but oxidation of the vicinity of edge is promoted, and therefore a silicon oxide film 18 is formed to be thick only around the corresponding portion. The subsequent steps are similar to those shown in and after FIG. 28 of the first embodiment.

When the element is formed by the method of the present embodiment, a region including a thick silicon oxide film is formed in the vicinity of the edge of a semiconductor region in which a channel is formed in a self-aligning manner. Also in the present embodiment, various modifications described in the first embodiment are possible, and a similar effect is obtained.

As described above, according to the present invention, controllability deterioration of the gate electrode with respect to the potential of the channel is minimized in the semiconductor device in which the region where the channel is formed has the edge. Moreover, the electric field in the gate insulating film is reduced, and the reliability of the element increases. That is, the short channel effect is effectively suppressed and current driving capability is kept to be satisfactory while the reliability of the element increases. As a result, a high-performance semiconductor device is realized having a high current driving capability, high reliability, and high performance.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a plate of semiconductor layer;
   an insulator layer containing a metal element on the plate of semiconductor layer and in contact with at least two adjoining faces of the plate of semiconductor layer, a thickness of the insulator layer being larger in the vicinity of a boundary line at a corner between the two adjoining faces of the plate of semiconductor layer than in a region other than the vicinity of the boundary line; and
   a band of conductor layer facing a middle portion of the plate of semiconductor layer via the insulator layer.

2. The semiconductor device according to claim 1, further comprising:
   a pair of conductive regions in the plate of semiconductor layer and on the respective sides of the middle portion of the plate of semiconductor layer, the conductive regions each including a region overlapping with the band of conductor layer.

3. The semiconductor device according to claim 1, wherein the insulator layer comprises at least two stacked layers on both of the at least two adjoining faces of the plate of semiconductor layer in the vicinity of the boundary line such that the at least two stacked layers are continuously formed in the vicinity of the boundary line, the at least two stacked layers including a layer having the smallest permittivity covering the two adjoining faces, and the thickness of the layer having the smallest permittivity is larger in the vicinity of the boundary line than in a region other than the vicinity of the boundary line.

4. The semiconductor device according to claim 3, wherein a layer having the largest permittivity in the stacked layers exists closer to the semiconductor layer than the layer having the smallest permittivity.

5. The semiconductor device according to claim 1, wherein the insulator layer comprises at least three stacked layers in the vicinity of the boundary line,
   the at least three stacked layers including two layers having the smallest permittivity and a third layer therebetween, and
   a thickness of at least one of the two layers having the smallest permittivity is larger in the vicinity of the boundary line than in a region other than the vicinity of the boundary line.

6. The semiconductor device according to claim 1, wherein a portion of the boundary line of the semiconductor layer is rounded.

7. The semiconductor device according to claim 1, wherein the metal element is one selected from the group consisting of Hf, Zr, Ti, Sc, Y, Ta, Al, La, Ce, and Pr.

8. The semiconductor device according to claim 7, wherein the insulator layer is either one of a first compound including the metal element and oxygen, or a second compound including the first compound and a silicon oxide.

9. The semiconductor device according to claim 1, wherein the insulator layer further contains nitrogen.

* * * * *